United States Patent [19]
Ohzu et al.

[11] Patent Number: 5,378,914
[45] Date of Patent: Jan. 3, 1995

[54] SEMICONDUCTOR DEVICE WITH A PARTICULAR SOURCE/DRAIN AND GATE STRUCTURE

[75] Inventors: Hayao Ohzu, Fuchu; Tetsunobu Kochi, Hiratsuka, both of Japan

[73] Assignee: Canon Kabushiki Kaisha, Tokyo, Japan

[21] Appl. No.: 997,135

[22] Filed: Dec. 24, 1992

Related U.S. Application Data

[63] Continuation of Ser. No. 706,188, May 28, 1991, abandoned.

[30] Foreign Application Priority Data

May 31, 1990 [JP] Japan .................. 2-139618
Aug. 8, 1990 [JP] Japan .................. 2-208145

[51] Int. Cl.$^6$ ............... H01L 27/085; H01L 27/088; H01L 27/092; H01L 29/60
[52] U.S. Cl. ..................... 257/369; 257/374; 257/330; 257/618; 257/622
[58] Field of Search ............ 357/42, 23.4, 23.3, 357/86, 68, 23.6; 257/369, 618, 622, 374, 370, 330, 331, 332

[56] References Cited

U.S. PATENT DOCUMENTS

| | | | |
|---|---|---|---|
| 4,740,826 | 9/1985 | Chatterjee | 257/369 |
| 4,768,076 | 8/1988 | Aoki et al. | 257/369 |
| 4,967,257 | 10/1990 | Inoue | 357/42 |
| 5,010,386 | 4/1991 | Grover, III | 257/369 |
| 5,016,070 | 5/1991 | Sandaresan | 357/42 |
| 5,021,845 | 6/1991 | Hashimoto | 357/23.4 |

FOREIGN PATENT DOCUMENTS

| | | |
|---|---|---|
| 0284065 | 9/1988 | European Pat. Off. |
| 0162457 | 6/1982 | Japan .................. 257/734 |
| 59-35463 | 2/1984 | Japan . |
| 61-08969 | 1/1986 | Japan . |
| 61-136682 | 6/1986 | Japan . |
| 63-288057 | 11/1988 | Japan . |
| 0288057 | 11/1988 | Japan . |
| 01244646 | 9/1989 | Japan . |
| 2055247 | 2/1981 | United Kingdom . |

OTHER PUBLICATIONS

"Integrated Electronics: Analog and Digital circuits and systems"; Millman et al; 1972 pp. 328–332.

*Primary Examiner*—Rolf Hille
*Assistant Examiner*—Wael M. Fahmy
*Attorney, Agent, or Firm*—Fitzpatrick, Cella, Harper & Scinto

[57] ABSTRACT

There is provided a semiconductor device with very small functional elements, which can be constructed by necessary minimum components without any unnecessary surface area, thus being capable of significantly reducing the layout area and adapted for achieving a fine geometry and a high level of integration. The semiconductor device is provided with a first semiconductor area of a first conductive type (for example a p$^-$ well) and a second semiconductor area formed on or under the first semiconductor area and having a second conductive type different from the first conductive type (for example a source or drain area), in which an electrode electrically connected to the first semiconductor area is formed through the second semiconductor area, and the first and second semiconductor areas are short-circuited by the above-mentioned electrode.

12 Claims, 16 Drawing Sheets

WINDOW FORMING STEP

ETCHING PROCESS SHAPING STEP

SHAPING STEP

WINDOW FORMING STEP

WIRING STEP

SEMICONDUCTOR DEVICE WITH A PARTICULAR SOURCE/DRAIN AND GATE STRUCTURE

This application is a continuation of application Ser. No. 07/706,188 filed May 28, 1991, now abandoned.

BACKGROUND OF THE INVENTION

1. Field of the Invention

The present invention relates to a semiconductor integrated circuit such as a memory, a photoelectric converting device, a signal processing device or the like adapted for use in various electronic appliances, and more particularly to a semiconductor device featured in the electrode structure of functional elements and a method for producing the same.

2. Related Background Art

For providing a highly integrated semiconductor circuit device, the development of miniaturized functional elements, such as a MOS transistor with a submicron gate length, has been found desirable in recent years. As a specific example, a MOS transistor with a gate length of 0.8 $\mu$m occupies an area of ca 20 $\mu$m$^2$, suitable for a high level of integration.

However the higher level of integration achieved by the miniaturization of functional elements has not necessarily lead to the anticipated satisfactory characteristics. Such discrepancy has been considered attributable to the method for producing such functional elements, and the efforts to solve such drawback has inevitably been directed to the improvement in such producing method. Stated differently, the predominant perception has been that the preparation of a satisfactorily functioning element in stable and reproducible manner is an important factor for the improvement of production yield.

However, the detailed investigation of the present inventors on the element structure and on the producing method therefor has revealed that a novel structure in the electrodes and/or the wirings therefor can achieve a finer geometry and a higher level of integration, with improved performance. This fact will be explained in the following, taking a MOSFET and a planar CMOS transistor as examples.

FIG. 1A is a schematic plan view of an example of the conventional function element, and FIG. 1B is a schematic cross-sectional view along a line A—A' in FIG. 1A.

There are illustrated an n-type semiconductor substrate 1, and a p$^-$-type semiconductor area (p$^-$-well) 2, in which are formed a drain area 3 and a source 4 both of an n$^+$-type semiconductor, and a sub area for ohmic connection of the p$^-$well 2 with an electrode. Above a channel area in the p$^-$well 2, there is provided a gate electrode 6 across a gate insulation film, and an n-channel MOSFET is thus formed. A drain electrode 7 and a source electrode 8 respectively contact with the drain area 3, and with the source and sub areas 4, 5 through contact holes formed in an insulation layer 9, Multi-terminal elements, such as functional elements, are often used with a fixed potential at a terminal. The above-explained MOSFET is used with the source and sub areas thereof maintained at a same potential. For this purpose, the sub area 5 is positioned horizontally next to the source area 4 across a field insulation film 10, and said source area 4 and sub area 5 are short-circuited by the source electrode 8 connected through the contact holes.

Such structure requires a plurality of field insulation films 10 and contact holes positioned in the horizontal direction, thus occupying a large area, and cannot achieve a sufficiently high level of integration even if a fine geometry can be realized.

For resolving the above-mentioned drawback, there is proposed a semiconductor device as shown in FIGS. 2A and 2B, which are respectively a schematic plan view and a schematic cross-sectional view along a line B—B' in FIG. 2A. In this structure, the source area 4 and the sub area 5 are positioned in mutually contacting manner, thereby dispensing with the field insulation film therebetween and requiring only one contact hole for said two areas, instead of one contact hole for each area.

However, even in this structure, the horizontal positioning of the source area 4 and the sub area 5 requires an excessive surface area. Also the contact hole requires a certain large diameter for achieving sufficient short-circuiting of the source area 4 and the sub area 5, so that the design freedom of the production process is difficult to increase.

In the following there will be explained an example of the planar CMOS transistor.

The logic circuit in an integrated circuit requires functional elements with features such as possibility for a high level of integration, a high-speed operation, a low power consumption etc., and the planar CMOS transistors have been recently used as the elements meeting such requirements for constituting the logic circuit. FIG. 3 schematically illustrates the structure of an inversion logic circuit composed of conventional planar CMOS transistors.

On a p-type substrate 501, there are formed an n$^-$ layer 502, a p$^-$-layer 503, a LOCOS oxide film 504, and an interlayer insulation film 505. The PMOS transistor includes an n layer 506 for obtaining he substrate potential, a p drain layer 507 and a p$^+$ source layer 508, while the NMOS transistor includes an n$^+$ source layer 509, an n$^+$ drain layer 510 and a p$^+$ layer 511 for obtaining the substrate potential. There are further provided a gate oxide film 512, a gate electrode 513 for the PMOS transistor and a gate electrode 514 for the NMOS transistor.

The drain 507 and the n$^+$ layer 506 of the PMOS transistor are given a highest potential, while the drain 510 and the p$^+$ layer 511 of the NMOS transistor are given a lowest potential. The gate electrodes 513, 514 of the PMOS and NMOS transistors are mutually connected by a metal wiring to constitute an input terminal, while the sources 508, 509 of said transistors are mutually connected by a metal wiring to constitute an output terminal, whereby an inversion logic circuit is constructed.

When a voltage equal to or higher than V$_{th}$ of the NMOS transistor, for example the highest potential, is applied to the gate electrodes 513, 514, a channel is formed below the gate of the NMOS transistor, whereby the drain 510 and the source 509 are connected. Thus an electron current flows through said channel, thus maintaining the output terminal at the lowest potential.

Then, when a voltage equal to or lower than (highest potential+V$_{th}$ of PMOS transistor), for example the lowest potential, is applied to the gate electrodes 513, 514, a channel is formed below the gate of the PMOS transistor, whereby the drain 507 and the source 508 thereof are connected. Thus a hole current flows through said channel, thus maintaining the output terminal at the highest potential.

The inverter function is thus realized, as the output terminal is maintained at the lowest or highest potential respectively when the highest or lowest potential is given to the input terminal.

In such conventional CMOS transistors, the device dimension is reduced by miniaturization of the gate length, contact holes and wiring width. However such conventional structure requires formation of gate areas on the surface, and isolation of the NMOS and PMOS transistors by a LOCOS oxide film, so that the device dimension has a limitation and a further reduction in size is difficult to achieve.

SUMMARY OF THE INVENTION

In consideration of the foregoing, an object of the present invention is to provide a semiconductor device suitable for achieving a fine geometry and a higher level of integration.

Another object of the present invention is to provide a semiconductor device including very small-sized functional elements.

Still another object of the present invention is to provide a semiconductor device in which the number of electrodes is reduced and the element isolation area can be reduced in size, that the dimension of the element can be further reduced.

Still another object of the present invention is to provide a method for producing a semiconductor device suitable for achieving a fine geometry and a higher level of integration.

Still another object of the present invention is to provide a method for producing a semiconductor device capable of filling a fine contact hole or a fine, deep trench, thereby realizing satisfactory electrical connection.

Still another object of the present invention is to provide a method for producing a semiconductor device, capable of significantly improving the electrical characteristics of the above-mentioned semiconductor device and of improving the production yield.

For attaining the above-mentioned objects, the present invention is featured by the following structure. The semiconductor device of the present invention, provided with a first semiconductor area of a first conductive type, and a second semiconductor area, formed on said first semiconductor area, of a second conductive type different from said first conductive, is featured by facts that an electrode electrically connected to said first semiconductor area is formed through said second semiconductor area, and that said first and second semiconductor areas are electrically short-circuited by said electrode.

The above-explained structure is additionally featured by facts that said second semiconductor area is a source or drain area of a field effect transistor, and that said electrode is composed of aluminum or a conductive material principally composed of aluminum.

Said structure is further featured by facts that the field effect transistor has a buried drain area and a buried gate area, that a PMOS transistor and an NMOS transistor are formed on respective sides of said buried gate, that said second semiconductor area constitutes said buried drain area, and that said electrode reaching the drain area is provided in at least either of said PMOS and NMOS transistors.

Said structure is further featured by a fact that said electrode is composed of aluminum or a conductive material principally composed of aluminum.

An additional feature is that said semiconductor device is a NOT circuit element, a NOR circuit element or a NAND circuit element.

Also the semiconductor device producing method of the present invention is featured by a first step for forming an aperture in said second semiconductor area thereby exposing a part of said first semiconductor area, and a second step for depositing a conductive material in said aperture, wherein said second step is to deposit aluminum or a conductive material principally composed of aluminum into said aperture by a CVD method utilizing alkylaluminum hydride gas and hydrogen.

Said method is further featured by a fact that said alkylaluminum hydride is dimethylaluminum hydride.

The semiconductor device producing method of the present invention is furthermore featured by:
  a step for burying drain areas of PMOS transistor and an NMOS transistor in a semiconductor substrate;
  a step for forming an aperture so as to penetrate the junction portion between the drain area of said PMOS transistor and the drain area of said NMOS transistor;
  a step for forming an insulation film covering the internal surface of said aperture;
  a step for depositing, in said aperture, a common gate for said PMOS and NMOS transistors; and
  a step for forming a buried electrode reaching at least either of the buried drain area of said PMOS transistor and the buried drain area of said NMOS transistor.

Said method is further featured by a fact that said buried electrode is formed by formation of an aperture reaching at least either of said two buried drain areas, and by selective deposition of aluminum in said aperture by a CVD method utilizing dimethylaluminum hydride and hydrogen.

The present invention can provide a semiconductor device including very small functional elements which can be formed with necessary minimum components without unnecessary planar areas, thereby being capable of significantly reducing the layout area and adapted for achieving a fine geometry and a high level of integration.

Also the present invention allows the reduction of the number of electrodes and the reduction of the element isolation area in size, thereby further decreasing the dimension of the element.

Furthermore, the present invention utilizes aluminum electrode formation by low-temperature aluminum deposition by a CVD method utilizing alkylaluminum hydride gas and hydrogen, thereby significantly improving the electrical characteristics and the production yield.

BRIEF DESCRIPTION OF THE DRAWINGS

FIGS. 1A and 1B illustrate an example of the conventional semiconductor device, wherein FIG. 1A is a schematic pan view thereof and FIG. 1B is a schematic cross-sectional view along a line A—A' in FIG. 1A;

FIGS. 2A and 2B illustrate another example of the conventional semiconductor device, wherein FIG. 2A is a schematic plan view thereof and FIG. 2B is a schematic cross-sectional view along a line B—B' in FIG. 2A;

DETAILED DESCRIPTION OF THE PREFERRED EMBODIMENTS

Now the present invention will be clarified in detail by preferred embodiments thereof.

A preferred embodiment of the present invention is constructed in the following manner. In functional elements such as field effect transistor, bipolar transistor, diffusion resistor etc., terminals to be used in an electrically short-circuited state are formed by forming, on a first semiconductor area of a first conductive type, a second semiconductor area of a second conductive type, and forming an electrode contacting said first semiconductor area through said second semiconductor area.

FIGS. 4A to 4D are schematic cross-sectional views showing various modes of the present invention.

Figure 4A:
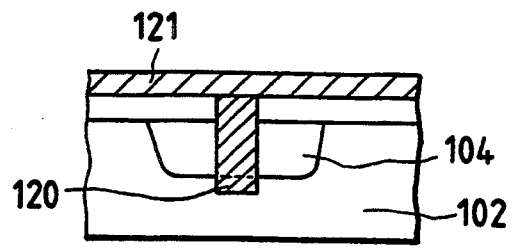
FIGS. 4A, 4B; 4C and 4D are cross-sectional views showing features of the semiconductor device of the present invention and illustrating variations thereof.

In an example shown in FIG. 4A, there is formed an electrode 120 which reaches a first semiconductor area 102, penetrating the center of a second semiconductor area 104.

Figure 4B:
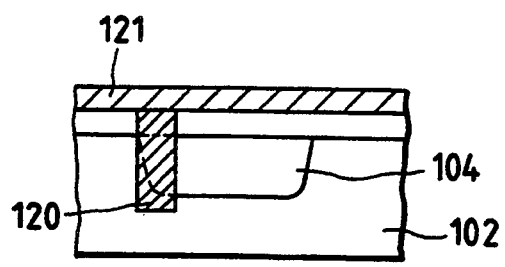

In an example shown in FIG. 4B, the electrode 120 reaches the first semiconductor area 102 through an end portion of the second semiconductor area 104.

Figure 4C:
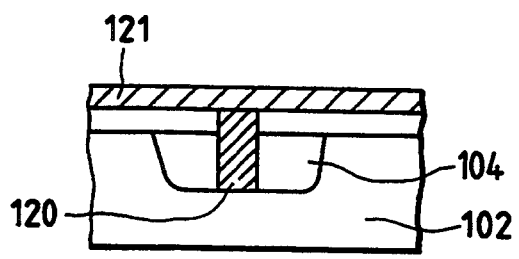

In an example shown in FIG. 4C, the electrode 120 does not sink into the first semiconductor area 102, as in the case of FIG. 4A, but merely contacts the upper surface thereof. 121 indicates a source electrode wiring.

Figure 4D:
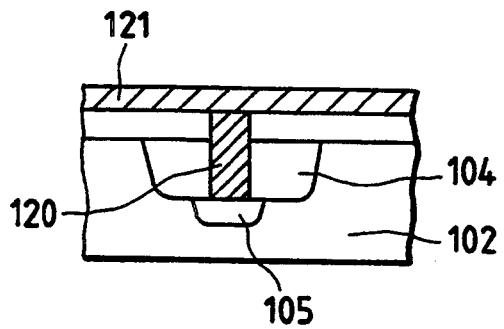

FIGS. 4A to 4C do not show the sub area. Such sub area can be dispensed with if the material of the electrode 120 can make ohmic contact with the first semiconductor area 102. If necessary, a sub area 105 may be formed, as shown in FIG. 4D, at a position where the electrode contacts the first semiconductor area 102. The electrode 120 is preferably provided with an insulation film on a large part of the lateral wall thereof and contacts the area 104 through a silicon area exposed in said insulation film.

Figure 5A:
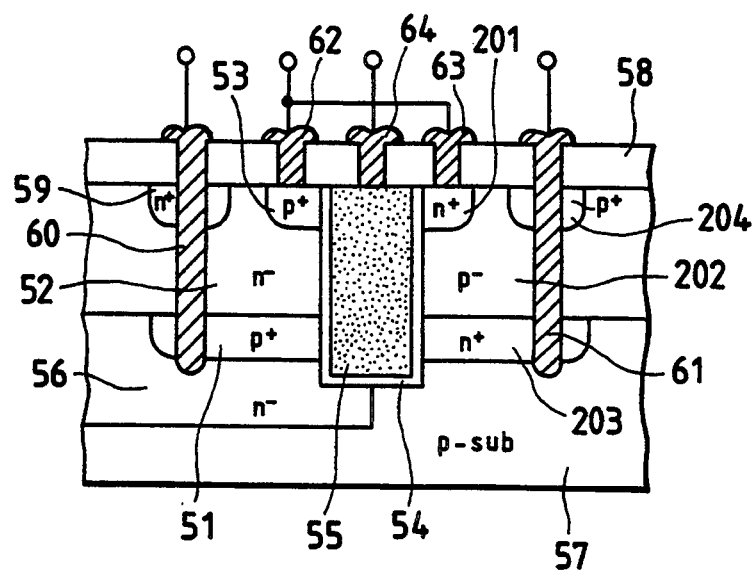
FIG. 5A is a cross-sectional view of a preferred embodiment of the present invention.
Figure 5B:
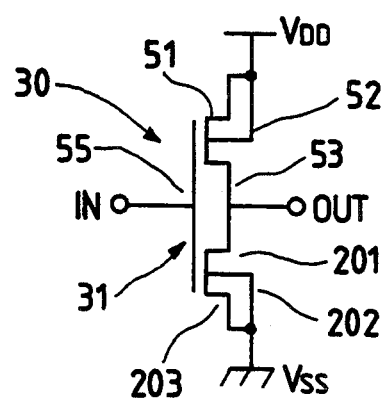
FIG. 5B is an equivalent circuit diagram thereof.

FIG. 5A is a schematic cross-sectional view of another embodiment of the present invention, and FIG. 5B is an equivalent circuit diagram thereof.

In FIG. 5A there are shown a p-type substrate 57, an n$^-$ diffusion layer 56, a buried drain area 51 of a PMOS transistor, a channel area 52 of the PMOS transistor, a source area 53 thereof, a gate oxide film 54 common for PMOS and NMOS transistor, a polysilicon gate 55, an insulation film 58, a source area 201 of an NMOS transistor, a channel area 202 thereof, a buried drain area 203 thereof, a buried electrode 60 common for the drain and well of the PMOS transistor, a buried electrode 61 common for the drain and well of the NMOS transistor, source electrodes 62, 63 respectively of the PMOS and NMOS transistors, and a common gate electrode 64.

As shown in the equivalent circuit in FIG. 5B, a highest potential is given to the drain 51 and the well 52 of the PMOS transistor 30, while a lowest potential is given to the drain 203 and the well 202 of the NMOS transistor 31. The common gate 55 of the PMOS and NMOS transistors constitutes an input terminal, while the sources 53, 201 of the PMOS and NMOS transistors are mutually connected to constitute an output terminal, whereby an inversion logic circuit is constituted. When the highest potential is applied to the input terminal, the NMOS transistor 31 is rendered conductive to provide the output terminal with the lowest potential. When the lowest potential is applied to the input terminal, the PMOS transistor 30 is rendered conductive to provide the output terminal with the highest potential. The inversion logic operation is thus realized.

In the present invention, as shown in FIG. 5A, fine buried electrodes 60, 61 are buried deep into the semiconductor substrate. In the prior art, it has been difficult to fill, even a contact hole of a large aspect ratio, completely with a conductive meterial, and it has been impossible to form a deep buried electrode as shown in FIG. 5A by metal deposition.

The present invention is based on a finding that a metal of satisfactory quality can be deposited with extremely good selectively by a novel CVD method to be explained later.

In the following there will be explained the process for producing the CMOS transistor shown in FIG. 5, with reference to FIGS. 6 to 17.

Figure 6:
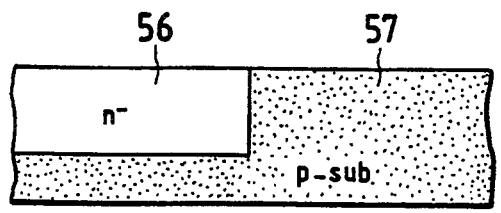
FIGS. 6 to 17 are views showing steps for producing the structure shown in FIG. 5.

At first, in the p-type substrate 57, the n⁻ diffusion layer 56 was formed by ion implantation and an annealing step (FIG. 6).

Figure 7:
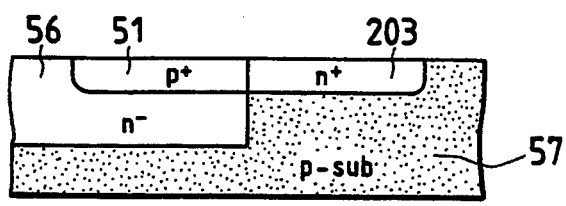

Then the n+ drain layer 203 in the substrate 57 and the p+ drain layer 51 in the n⁻ layer 56 were formed respectively by ion implantation and annealing (FIG. 7).

Figure 8:
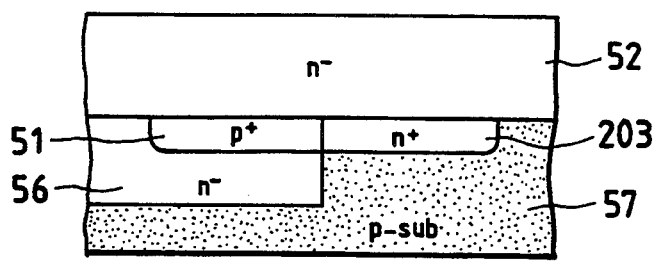

The n⁻ layer 52 was subsequently formed over the entire surface by CVD (FIG. 8).

Figure 9:
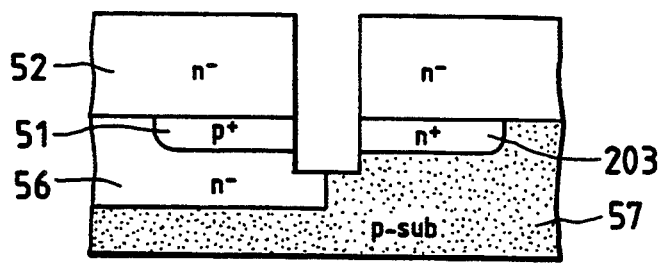

Then an etching process was conducted to form an aperture penetrating the n⁻ layer 52, p+ layer 51 and n+ layer 203 and reaching the n⁻ layer 56 (FIG. 9).

Figure 10:
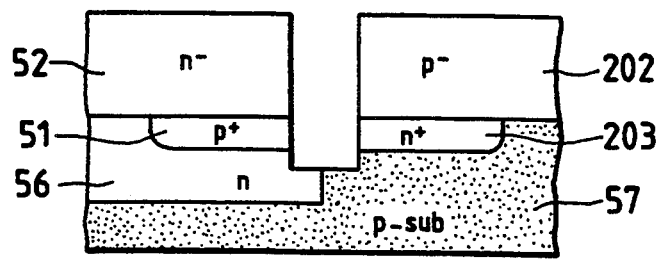

Ion implantation was conducted in an area for forming the NMOS transistor in the n⁻ layer, followed by annealing, the form the p⁻ layer 202 (FIG. 10).

Figure 11:
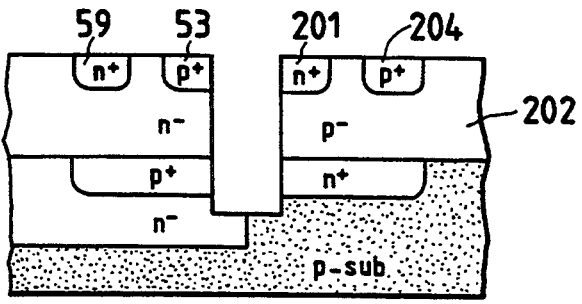

Then the p+ source area 53 and the n+ layer 59 for electrode connection were formed in the n⁻ layer 52, and the n+ source area 201 and the p+ area 204 for electrode connection were formed in the p⁻ layer 202, respectively by ion implantation and annealing (FIG. 11).

Figure 12:
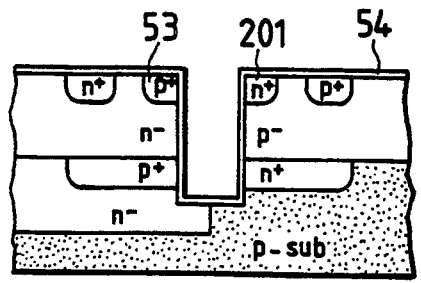

Then the gate oxide film 54 was formed by thermal oxidation (FIG. 12).

Figure 13:
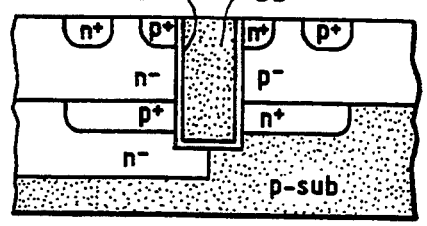
Figure 14:
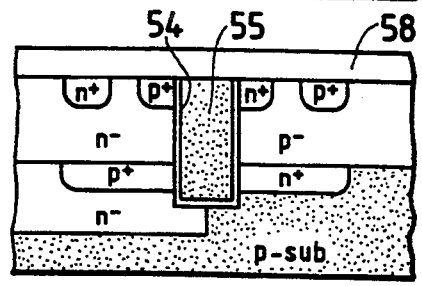

Subsequently polysilicon was deposited in the aperture by CVD, followed by an etch-back process, to form the buried polysilicon layer (FIG. 13).

Figure 15:
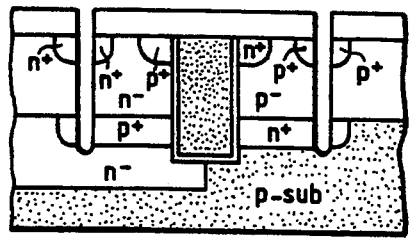

The interlayer insulation film 58 was deposited by CVD (FIG. 14), and the contact holes for the drains 51, 203 and the wells 52, 202 were formed by etching (FIG. 15).

Figure 16:
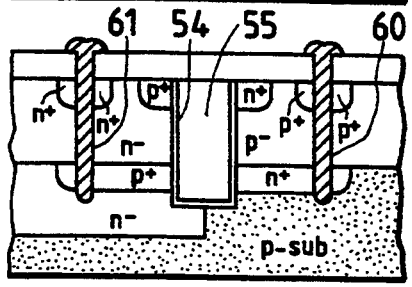

Then Al was deposited in the contact holes by the above-mentioned CVD utilizing DMAH and $H_2$, thereby forming the electrodes 60, 61 common for the drains and wells (FIG. 16).

Figure 17:
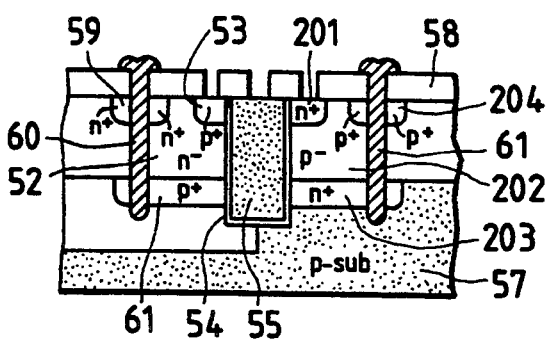

Contact holes for the source and the gate were formed by etching (FIG. 17).

Finally Al was deposited in the contact holes by CVD, and the source electrodes 111, 112 and the gate electrode 63 were formed to complete the structure shown in FIG. 5A. The inversion logic circuit was formed by patterning the Al wirings in such a manner that the source electrodes of the PMOS and NMOS transistors are mutually connected.

When a voltage equal to or higher than $V_{th}$ of the NMOS transistor, for example the highest potential, is applied to the gate electrode 55, a channel is formed below the gate of the NMOS transistor, whereby the drain 203 and the source 201 thereof are connected. Thus an electron current flow through said channel to maintain the output terminal at the lowest potential.

Then, when a voltage equal to or lower than (highest potential+$V_{th}$ of PMOS transistor), for example the lowest potential, is applied to the gate electrode 55, a channel is formed below the PMOS transistor, whereby the drain 51 and the source 53 thereof are connected. Thus a hole current flows through said channel to maintain the output terminal at the highest potential.

Thus the inverter operation is realized, as the output terminal is maintained at the lowest or highest potential respectively when the input terminal is given the highest or lowest potential.

The present embodiment can be constructed with only one gate electrode, and does not require an isolation area, as the gate serves to separate the PMOS and NMOS transistors. It is therefore rendered possible to reduce the number of electrodes and to reduce the isolation area in size, thereby obtaining a logic circuit of a reduced dimension.

The source electrodes 62, 63 and the gate electrode 64 may be composed, like the electrode 120 in the aforementioned first example or the buried electrodes 60, 61 in the second example, of polycrystalline silicon, Al, W, Mo, Cu, Al—Ci, Al—Cu, Al—Ti, A—Si—Ti, A—Si—Cu, $WSi_2$, $MoSi_2$ or $TiSi_2$, but, in consideration of the production process, they are preferably composed of aluminum or a material principally composed of aluminum such as Al—Si, Al—Cu, Al—Ti, Al—Si—Ti or Al—Si—Cu. Besides such material is preferably deposited by a depositing method to be explained in the following.

Film Forming Method

In the following there will be explained a film forming method suitable for electrode formation according to the present invention.

Said method is adapted for filling an aperture with a conductive material, for forming the electrode of the above-explained structure.

Said film forming method consists of forming a deposited film by a surface reaction on an electron donating substrate, utilizing alkylaluminum hydride gas and hydrogen gas (said method being hereinafter called Al—CVD method).

An aluminum film of satisfactory quality can be deposited by heating the surface of the substrate in the presence of a gaseous mixture particularly consisting of monomethylaluminum hydride (MMAH) or dimethylaluminum hydride (DMAH) as the raw material gas and hydrogen as the reaction gas. At the selective A deposition, the substrate surface is preferably maintained at a temperature at least equal to the decomposition temperature of alkylaluminum hydride but lower than 450° C., more preferably between 260° C. and 440° C., by direct or indirect heating.

The heating of the substrate in the abovementioned temperature range may be achieved by direct or indirect heating, but formation of an Al film of satisfactory quality can be achieved with a high deposition speed, particularly by direct heating. For example, with the more preferred temperature range of 260°–440° C., a satisfactory film can be obtained with a deposition speed of 300–5000 Å/min. which is higher than in the resistance heating. Such direct heating (substrate being heated by direct transmission of energy from the heating means) can be achieved by heating with a lamp such as a halogen lamp or a xenon lamp. Also indirect heating may be achieved for example by resistance heating, conducted by a heat generating member provided in a substrate support member, for supporting the substrate to be subjected to film deposition, provided in a film depositing space.

This method, if applied to a substrate having both an electron donating surface area and an electron non-donating surface area, enables forming single crystal of aluminum with satisfactory selectively solely on the electron donating surface area. Such aluminum is excellent in all the properties required for the electrode/wiring material, including a low hillock frequency and a low alloy spike frequency.

This is presumably because the semiconductive or conductive surface constituting an electron donating surface can selectively develop an aluminum film of satisfactory quality and excellent crystalline character and said Al film excludes or significantly reduces the alloy spike formation etc. resulting from an eutectic reaction with the underlying silicon. Such Al film, when employed as an electrode of a semiconductor device, provides the advantages far exeeding the concept of the conventional Al electrode and not anticipated in the prior technology.

As explained above, the Al deposited in an aperture with an electron donating surface, for example an aperture formed in an insulating film and exposing the surface of a semiconductor substrate therein, has a monocrystalline structure. Besides, said Al—CVD method can achieve selective deposition of following metal films principally composed of aluminum, with the same satisfactory quality.

For example, the electrode may be formed by selective deposition of various conductive materials such as Al—Si, Al—Ti, Al—Cu, Al—Si—Ti or Al—Si—Cu by the use of a mixed gaseous atmosphere employing, in addition to alkylaluminum hydride gas and hydrogen, a suitable combination of:

Si-containing gas such as $SiH_4$, $Si_2H_6$, $Si_3H_8$, $Si(CH_3)_4$, $SiCl_4$, $SiH_2Cl_2$ or $SiHCl_3$;
Ti-containing gas such as $TiCl_4$, $TiBr_4$ or $Ti(CH_3)_4$; and/or
Cu-containing gas such as copper bisacetylacetonate $Cu(C_5H_7O_2)_2$, copper bisdipyvaloylmethanite $Cu(C_{11}H_{19}O_2)_2$ or copper bishexafluoroacetylacetonate $Cu(C_5HF_6O_2)_2$.

Also, since said Al—CVD method is excellent in selectivity and provides satisfactory surface characteristics on the deposited film, there can be obtained a metal film suitable and widely usable for the wirings of a semiconductor device, by employing a non-selective film forming method in a next deposition step to form a metal film composed solely or principally of aluminum not only on the selectively deposited aluminum film mentioned above but also on the $SiO_2$ insulation film.

Examples of such metal films include combinations of selectively deposited Al, Al—Si, Al—Ti, Al—Cu, Al—Si—Ti or Al—Si—Cu and non-selectively deposited Al, Al—Si, Al—Ti, Al—Cu, Al—Si—Ti or Al—Si—Cu.

Said non-selective film deposition may be achieved by CVD other than the aforementioned Al—CVD, or by sputtering.

Film Forming Apparatus

In the following there will be explained a film forming apparatus suitable for the electrode formation according to the present invention.

Figure 18:
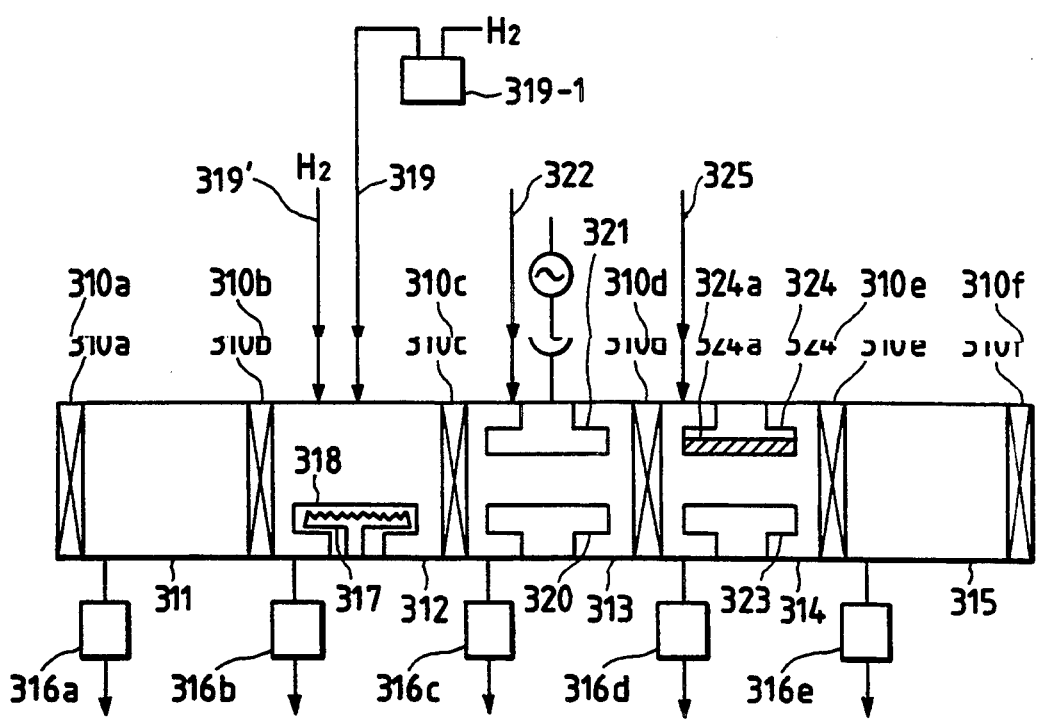
FIGS. 18 to 20 are schematic views of continuous metal film forming apparatus suitable for forming a CVD—Al film or a metal film principally composed of aluminum.
Figure 19:
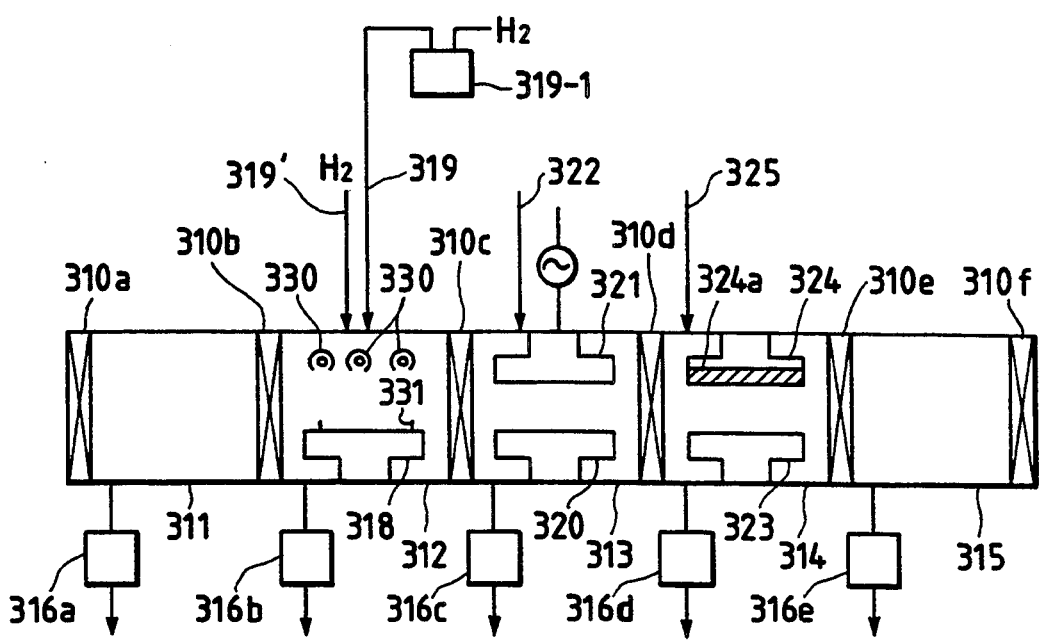
Figure 20:
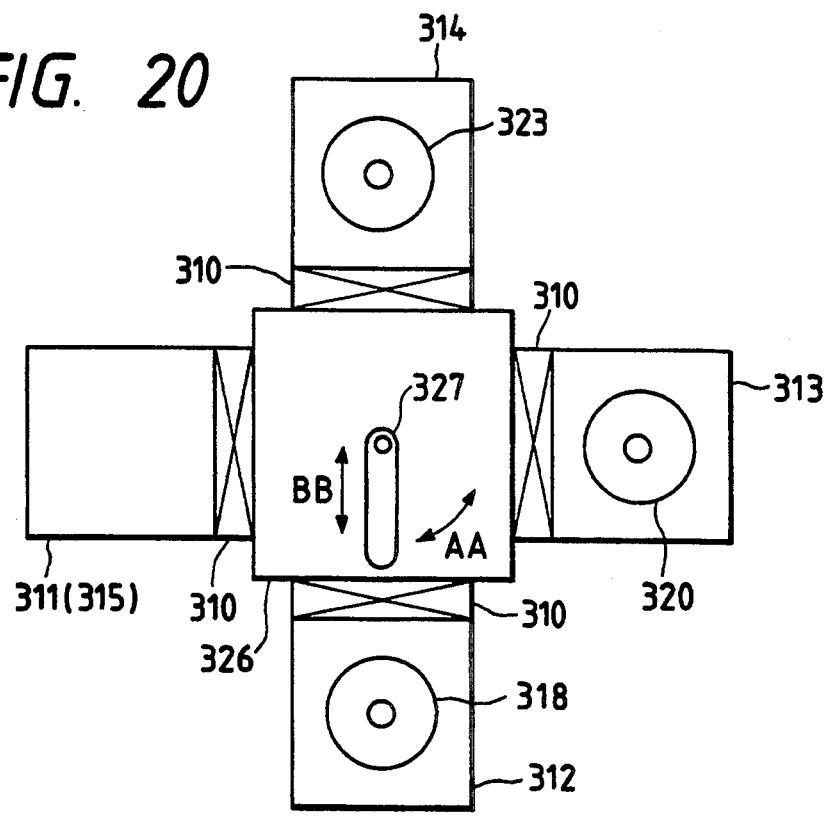

FIGS. 18 to 20 schematically illustrate a continuous metal film forming apparatus suitable for executing the film forming method explained above.

Figure 1A:
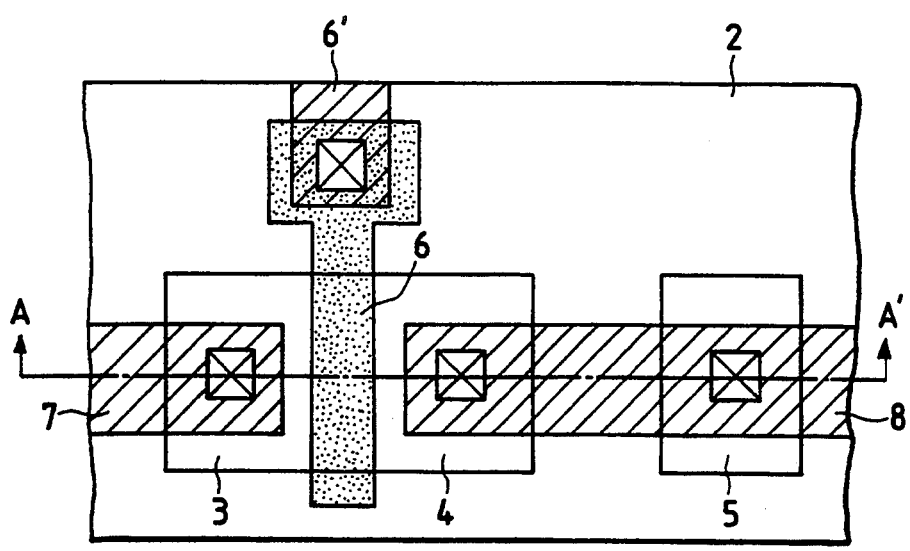
Figure 1B:
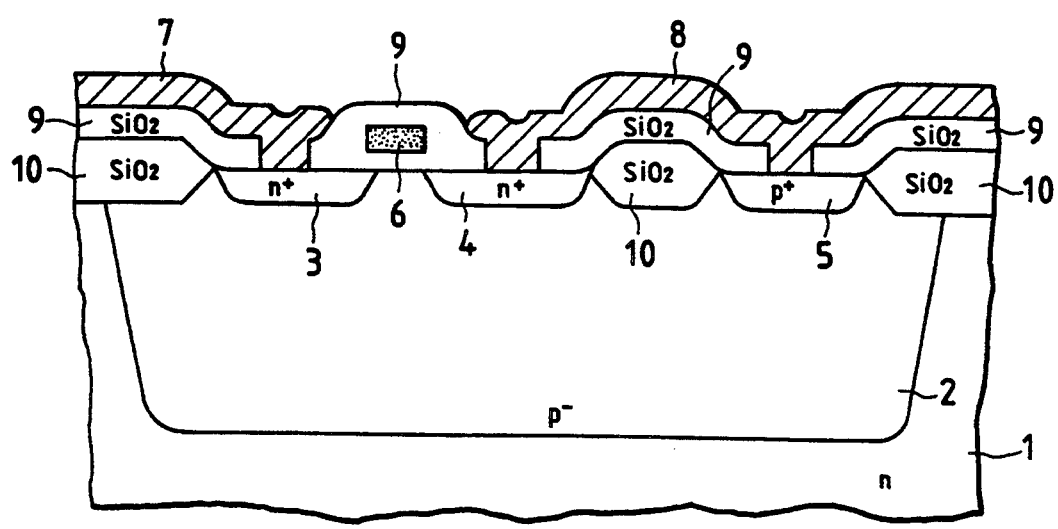
Figure 2A:
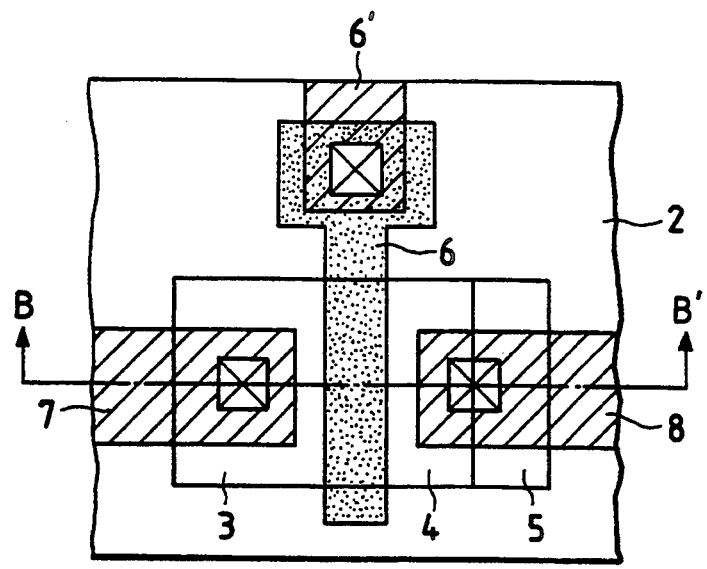
Figure 2B:
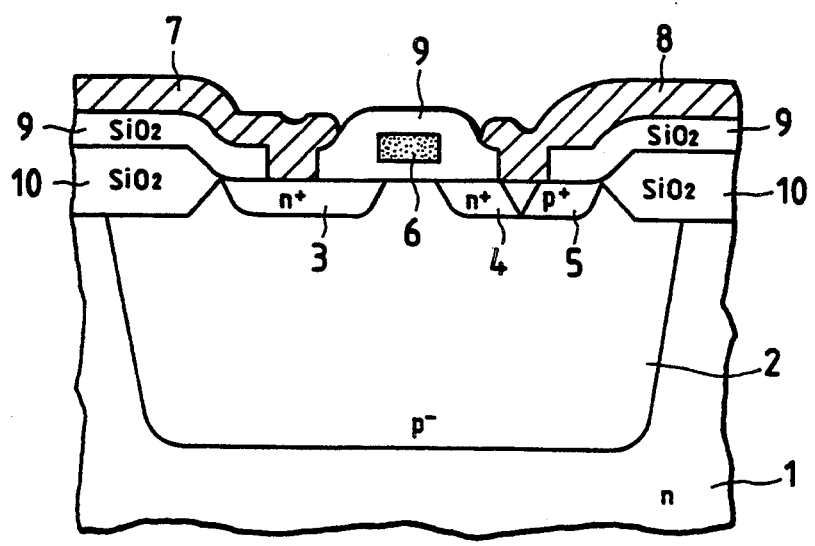
Figure 3:
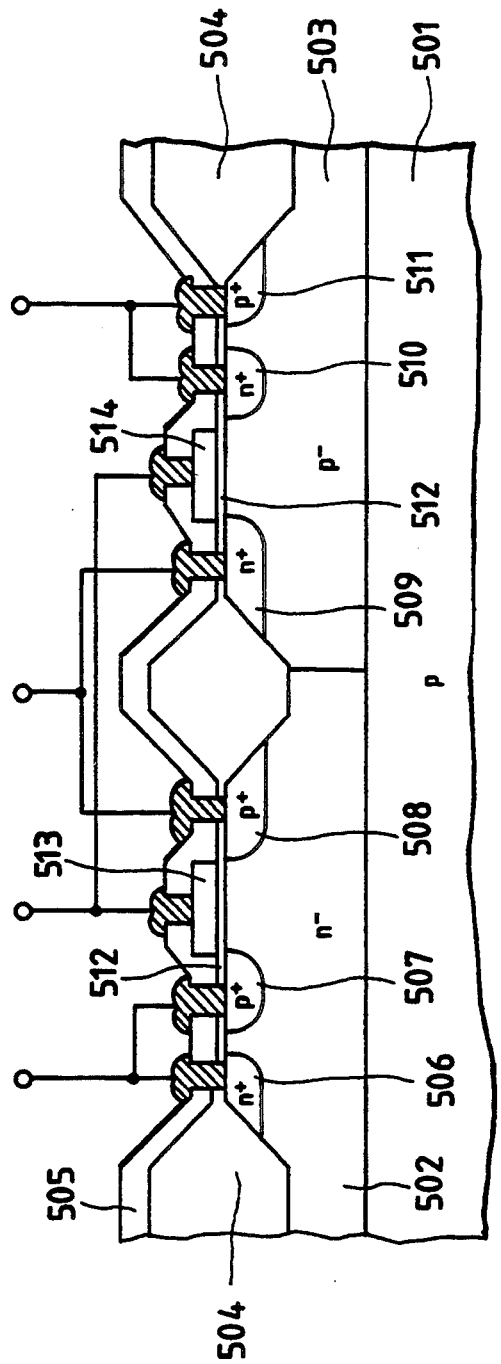
FIG. 3 is a schematic cross-sectional view of a conventional CMOS transistor.

As shown in FIG. 2, said apparatus is composed of a loading chamber 311, a CVD reaction chamber (first film forming chamber) 312, an Rf etching chamber 313, a sputtering chamber (second film forming chamber) 314 and an unloading chamber 315, which are rendered sealable from the external atmosphere and mutually communicatable by means of gate valves 310a–310f and can be respectively made vacuum or reduced in pressure by vacuum systems 316a–316e. The loading chamber 311 is used for eliminating the atmosphere of substrate and replacing it with $H_2$ prior to the deposition, in order to improve the throughput. The next CVD reaction chamber 312, for selective deposition onto the substrate under normal or reduced pressure, is provided therein with a substrate holder 318 with a resistance heater 317 for heating the substrate surface subjected to film formation at least within a temperature range of 200°–450° C., and receives the raw material gas such as of alkylaluminum hydride, which is gasified by bubbling with hydrogen in a bubbler 319-1, through a raw material gas supply line 319, and hydrogen as the reaction gas through a gas line 319'. The Rf etching chamber 313, for cleaning (etching) of the substrate surface in Ar atmosphere after the selective deposition, is provided therein with a substrate holder 320 capable of heating the substrate at least within a range of 100°–250° C. and an Rf etching electrode line 321, and is connected to an Ar gas supply line 322. The sputtering chamber 314, for non-selective deposition of a metal film by sputtering in Ar atmosphere, is provided therein with a substrate holder 323 to be heated at least within a range of 200°–250° C. and a target electrode 324 for mounting a sputtering target 324a, and is connected to an Ar gas supply line 325. The final unloading chamber 315, for adjustment of the substrate after metal film deposition and prior to the exposure to the external atmosphere, is designed to be capable of replacing the atmosphere with $N_2$.

FIG. 19 shows another example of the continuous metal film forming apparatus, wherein same components as those in FIG. 18 are represented by the same numbers. The apparatus in FIG. 19 is different from that in FIG. 18 in that the substrate surface is directly heated by halogen lamps 330, and, for this purpose, the substrate holder 312 is provided with projections 331 for supporting the substrate in a floating state.

Direct heating of the substrate surface with such structure further increases the deposition speed as explained before.

Figure 21:
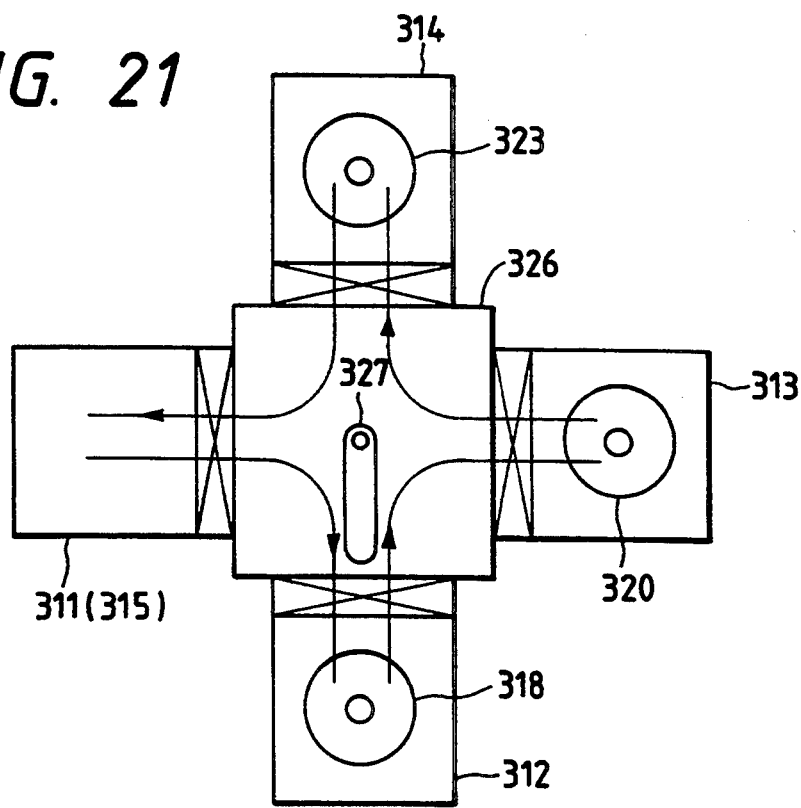
FIG. 21 is a view showing the function of the apparatus shown in FIG. 20.

The continuous metal film forming apparatus of the above-explained structure is equivalent, in practice, to a structure shown in FIG. 20, in which the loading chamber 311, CVD reaction chamber 312, Rf etching chamber 313, sputtering chamber 314 and unloading chamber 315 are mutually combined by a transport chamber 326. In this structure, the loading chamber 311 serves also as the chamber 315. In said transport chamber 326, there is provided an arm 327 constituting transport means, rotatable in both directions A—A and extendable and retractable in direction B—B, whereby the substrate can be transferred in succession from the loading chamber 311 to the CVD reaction chamber 312, Rf etching chamber 313, sputtering chamber 314, and finally to the unloading chamber 315 without exposure to the external atmosphere, as indicated by arrows in FIG. 21.

Film Forming Process

Now there will be explained the film forming process for forming the electrodes and wirings according to the present invention.

FIG. 22 illustrates the film forming procedure for forming the electrodes and wirings according to the present invention, in schematic perspective views.

Initially the outline of the procedure will be described. Al semiconductor substrate with an insulating film having apertures therein is placed in the film forming chamber, and the surface thereof is maintained for example at 250°–450° C. Thermal CVD conducted in a mixed atmosphere of DMAH gas as alkylaluminum hydride and hydrogen gas causes selective deposition of Al on the semiconductor exposed in the apertures. There may naturally be conducted selective deposition of a metal film principally composed of A, for example Al—Si, by introduction for example of Si-containing gas, as explained before. Then a metal film composed solely or principally of Al is non-selectively formed by sputtering, on the selectively deposited Al and on the insulation film. Subsequently the non-selectively deposited metal film is patterned into the shape of desired wirings, thereby obtaining the electrodes and the wirings.

This procedure will be explained in greater detail with reference to FIGS. 19 and 22. First a substrate is prepared, consisting, for example, of a monocrystalline silicon wafer bearing thereon grooves of different sizes, and covered by an insulation film except for the bottoms of said grooves.

Figure 22A:
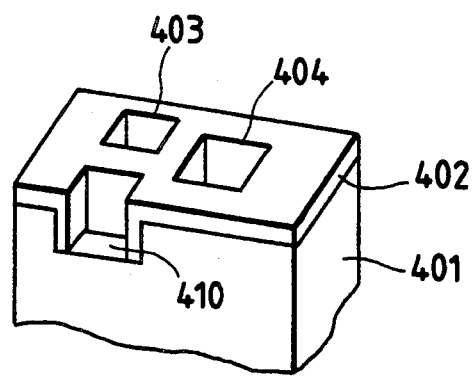
FIGS. 22A, 22B and 22C are schematic perspective views showing film forming procedure for forming electrodes and wirings by the Al—CVD method.

FIG. 22A schematically shows a part of said substrate, wherein shown are a monocrystalline silicon substrate 401 constituting a conductive substrate; a thermal silicon oxide film 402 constituting an insulation film; apertures 403,404 of different sizes; and a groove 410.

The formation of Al film, constituting a first wiring layer, on the substrate is conducted in the following manner, with the apparatus shown in FIG. 19.

At first the above-explained substrate is placed in the loading chamber 311, in which a hydrogen atmosphere is established by introduction of hydrogen as explained before. Then the reaction chamber 312 is evacuated by the vacuum system 316b approximately to $1 \times 10^{-8}$ Torr, though Al film formation is still possible with a higher pressure.

Then DMAH gas obtained by bubbling is supplied from the gas line 319, utilizing H$_2$ as the carrier gas.

Also hydrogen as the reaction gas is introduced from the second gas line 319', and the interior of the reaction chamber 312 is maintained at a predetermined pressure, by the adjustment of an unrepresented slow leak valve. Al typical pressure is about 1.5 Torr. DH is introduced into the reaction chamber from the DMAH line, with a total pressure of about 1.5 Torr and a DMAH partial pressure of about $5.0 \times 10^{-3}$ Torr. Then the halogen lamps 330 are energized to directly heat the wafer, thereby causing selective Al deposition.

After a predetermined deposition time, the DMAH supply is interrupted. Said deposition time is so selected that the Al film on Si (monocrystalline silicon substrate 1) becomes equally thick as SiO$_2$ (thermal silicon oxide film 2), and can be experimentally determined in advance.

Figure 22B:
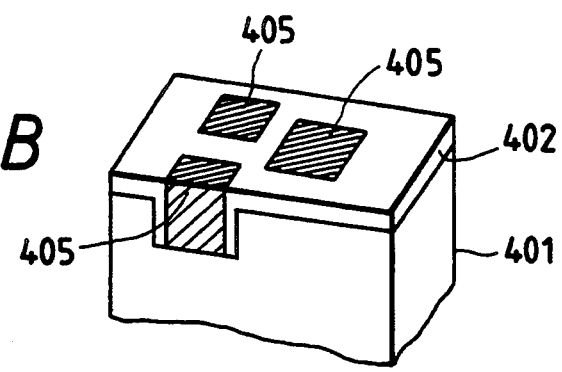

In this process, the substrate surface is heated to ca. 270° C. by direct heating, and the procedure explained above causes selective deposition of an Al film 405 in the aperture, as shown in FIG. 22B.

The foregoing is called a first film forming step for forming an electrode in an aperture.

After said first film forming step, the CVD reaction chamber 312 is evacuated, by the vacuum system 316b, to a pressure not exceeding $5 \times 10^{-3}$ Torr. Simultaneously the Rf etching chamber 313 is evacuated to a pressure not exceeding $5 \times 10^{-1}$ Torr. After confirmation of said evacuations of the chambers, the gate valve 310c is opened, then the substrate is moved from the CVD reaction chamber 312 to the Rf etching chamber 313 by the transport means, and said gate valve is closed. The Rf etching chamber 313 is evacuated to a pressure not exceeding $10^{-6}$ Torr, and is then maintained in argon atmosphere of $10^{-1}$–$10^{-3}$ Torr by argon supply from the supply line 322. The substrate holder 320 is maintained at ca. 200° C., and an Rf power of 100 W is supplied to the Rf etching electrode 321 for about 60 seconds to generate an argon discharge n said chamber 313, whereby the substrate surface is etched with argon ions and the unnecessary surficial layer of the CVD deposition film can be eliminated. The etch depth in this case is about 100 Å, corresponding to the oxide film. Said surface etching, of the CVD deposition film, conducted in the Rf etching chamber, may be dispensed with since said surficial layer is free from oxygen etc. as the substrate is transported in vacuum. In such case, the Rf etching chamber 313 may serve for varying the temperature within a short time if the temperature is significantly different between the CVD reaction chamber 312 and the sputtering chamber 314.

After said Rf etching, the argon supply is terminated, and the Rf etching chamber 313 is evacuated to $5 \times 10^{-6}$ Torr. Then the sputtering chamber is also evacuated to $5 \times 10^{-6}$ Torr or lower, and the gate valve 310d is opened. The substrate is transferred from the Rf etching chamber 313 to the sputtering chamber 314 by the transport means, and said gate valve 310d is closed.

Subsequently, the sputtering chamber is maintained at argon atmosphere of $10^{-1}$–$10^{-3}$ Torr as in the Rf etching chamber 313, and the substrate holder 323 is maintained at 200°–250° C. Argon discharge is induced by a DC power of 5–10 kW to scrape the target of Al or Al—Si (Si: 0.5%) with argon ions, thereby depositing Al or Al—Si onto the substrate with a deposition speed of ca. 10000 Å/min. This is a non-selective deposition step, and is called a second film forming step for forming wirings connected to the electrodes.

After the formation of the metal film of about 5000 Å on the substrate, the argon supply and the DC power application are terminated. The loading chamber 311 is evacuated to a pressure of $5 \times 10^{-3}$ Torr or lower, then the gate valve 310e is opened and the substrate is moved. After the gate valve 310e is closed, the loading chamber 311 is supplied with nitrogen gas to the atmospheric pressure. Subsequently the gate valve 310f is opened and the substrate is taken out.

Figure 22C:
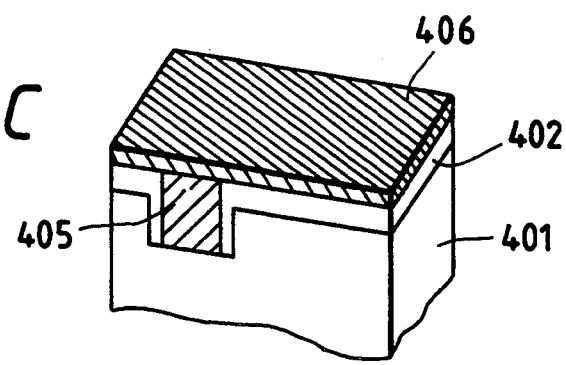

The second Al film deposition step explained above forms an Al film 406 on the SiO$_2$ film 402, as shown in FIG. 22C.

Subsequently said Al film 406 is patterned to obtain the wirings of desired shape.

Experimental Examples

In the following there will be shown experimental results indicating the superiority of the above-explained Al—CVD method and the satisfactory quality of the Al film deposited by said method in the apertures.

Plural substrates were prepared, each consisting of an N-type monocrystalline silicon wafer, provided thereon with a thermally oxidized SiO$_2$ film of a thickness of 8000 Å, in which grooves of different sizes from $0.25 \times 0.25$ μm to $100 \times 100$ μm were formed by patterning to expose the underlying monocrystalline silicon (samples 1-1).

These samples were subjected to the Al film formation by the Al—CVD method, employing DMAH as the raw material gas and hydrogen as the reaction gas, with a total pressure of 1.5 Torr and a DMAH partial pressure of $5.0 \times 10^{-3}$ Torr, and with the substrate surface temperatures selected in a range of 200°–490° C. by direct heating under the regulation of electric power supplied to the halogen lamps. The obtained results are summarized in Table 1.

TABLE 1

| Substrate surface temp. (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (Å/min.) | ← 1000–1500 → | | | ← 3000–5000 →  | | | | | | | | | | | |
| Si linear defects | ← not observed → | | | | | | | | | | | | | | |
| Carbon content | ← not observed → | | | | | | | | | | | | | | |
| Resistivity (μΩ cm) | ← 2.7–3.3 → | | | ← 2.8–3.4 → | | | | | | | | | | | |
| Reflectance (%) | ← 8.5–9.5 → | | | ← 90–95 → | | | | | | ← ca. 60 → | | | | | |
| Hillock (>1 μm) density (cm$^{-2}$) | ← 1–10$^2$ → | | | ← 0–10 → | | | | | | ← 10–10$^4$ → | | | | | |
| Spike formation (%) destruction frequency of 0.15 μm junction) | ← 0 → | | | | | | | | | ← 0–30 → | | | | | |

As will be apparent from Table 1, aluminum was deposited in the apertures with a deposition speed as high as 3000–5000 Å/min. at the substrate surface temperature of 260° C. or higher obtained by direct heating.

The Al film in the apertures, obtained in a substrate surface temperature range of 260°–440° C., showed satisfactory characteristics, with no carbon content, a resistivity of 2.8–3.4 μΩcm, a reflectance of 90–95% a hillock ($\geq 1$ μm) density of 0–10 cm$^2$, and an almost zero spike formation (frequency of destruction of 0.15 μm junction).

On the other hand, though the film quality obtained in a surface temperature range of 200°–250° C. was somewhat inferior to that obtained in the temperature range of 260°–440° C., it is considerably better than that obtainable with the conventional technology, but the deposition speed could not exceed 1000–1500 Å/min.

At the substrate surface temperature equal to or higher than 450° C., the quality of the Al film in the apertures deteriorated, with a reflectance of 60% or lower, a hillock ($\geq 1$ μm) density of 10–10$^4$ cm$^{-2}$ and an alloy spike formation of 0–30%.

In the following there will be explained how the above-explained method can be advantageously applied to the filling of the grooves.

Said method can be advantageously applied to the grooves composed of the materials explained in the following.

The Al film formation was conducted on the following substrates (samples) under the same conditions as in the Al film formation on the above-mentioned samples 1-1.

Samples 1-2 were prepared by forming, on monocrystalline silicon constituting a first substrate surface material, a silicon oxide film constituting a second substrate surface material by means of CVD method, and forming grooves by a photolithographic process to locally expose the surface of monocrystalline silicon in the bottoms of said grooves. The thermal SiO$_2$ film was 8000 Å thick, and the exposed areas of monocrystalline silicon were sizes from 0.25×0.25 μm to 100×100 μm, with a groove depth of 2 μm. (Such samples will hereinafter be represented as "CVD SiO$_2$ (or simply SiO$_2$)-/monocrystalline silicon".)

There were also prepared:
a sample 1-3 of boron-doped oxide film formed by normal pressure CVD (hereinafter written as BSG)/monocrystalline silicon;
a sample 1-4 of phosphor-doped oxide film formed by normal pressure CVD (PSG)/monocrystalline silicon;
a sample 1-5 of boron- and phosphor-doped oxide film formed by normal pressure CVD (BSPG)/monocrystalline silicon;
a sample 1-6 of nitride film formed by plasma CVD (P-SiN)/monocrystalline silicon;
a sample 1-7 of thermal nitride film (T-Sin)/monocrystalline silicon;
a sample 1-8 of nitride film formed by low pressure CVD (LP-SiN)/monocrystalline silicon; and
a sample 1-9 of nitride film formed by ECR (ECR-SiN)/monocrystalline silicon.

Further, samples 1-11 to 1-179 were prepared by taking all the combinations of the first surface materials of 18 kinds and the second surface materials of 9 kinds shown in the following. (It is to be noted that the sample numbers 1-10, 20, 30, 40, 50, 60, 70, 80, 90, 100, 110, 120, 130, 140, 150, 160 and 170 are lacking.) The first surface materials employed were monocrystalline silicon (mono-Si), polycrystalline silicon (poly-Si), amorphous silicon (a-Si), tungsten (W), molybdenum (Mo), tantalum (Ta), tungsten silicide (WSi), titanium silicide (TiSi), aluminum (Al), aluminum silicon (Al—Si), titanium aluminum (Al—Ti), titanium nitride (Ti—N), copper (Cu), aluminum silicon copper (A—Si—Cu), aluminum palladium (Al—Pd), titanium (Ti), molybdenum silicide (Mo—Si), and tantalum silicide (Ta—Si). The second substrate surface materials employed were T—SiO$_2$, SiO$_2$, BSG, PSG, BPSG, P—SiN, T—SiN, LP—SiN and ECR—SiN. In all these samples, there could be obtained satisfactory Al films comparable to those in the aforementioned samples 1-1.

Subsequently, the Al was non-selectively deposited by sputtering on the substrates subjected to the selective Al deposition as explained above, and was then patterned. Such deposited film is effective for three-dimensional connections of buried wirings.

The Al film obtained by sputtering and the selectively deposited Al film in the apertures showed electrically and mechanically satisfactory contact, because of the improved surface state of the Al film in the apertures.

EMBODIMENT 1

In the following there will be explained a MOSFET constituting a first embodiment of the present invention.

Figure 23A:
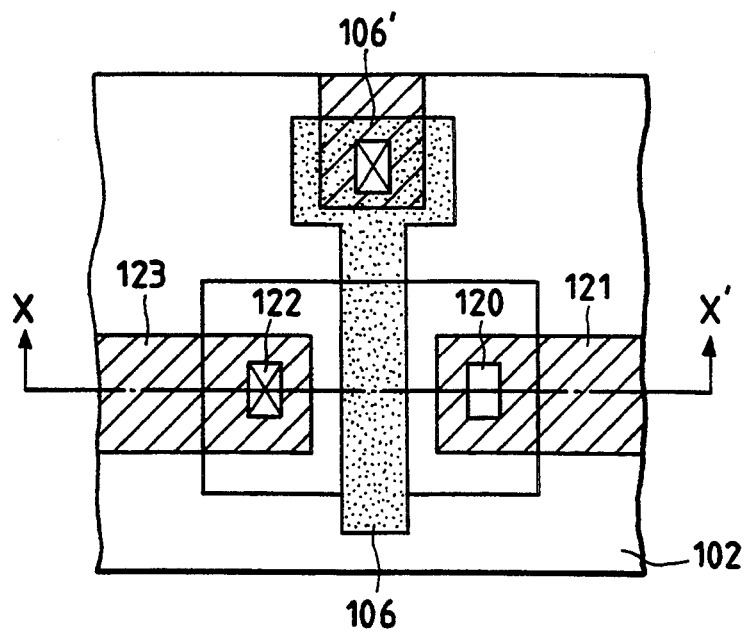
FIG. 23A is a schematic plan view of a MOSFET constituting a first embodiment of the present invention.
Figure 23B:
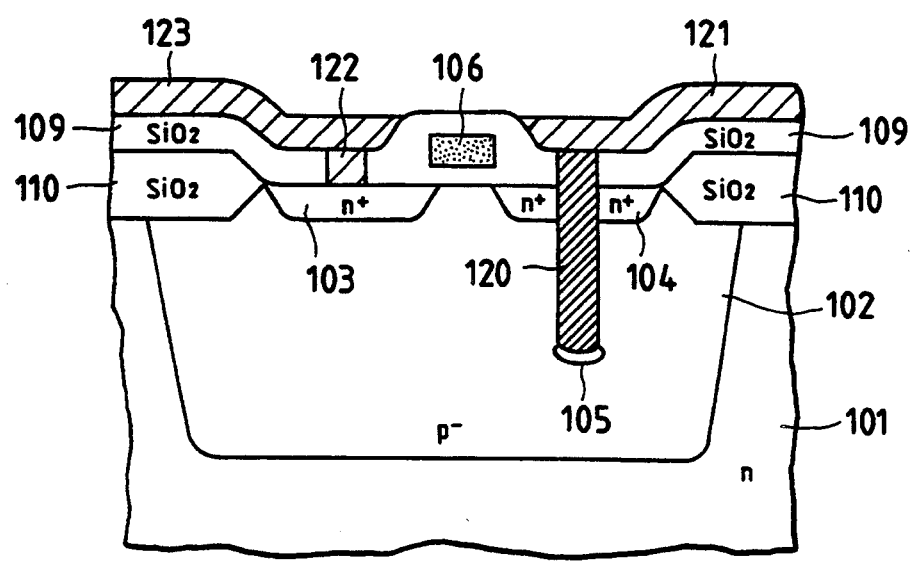
FIG. 23B is a schematic cross-sectional view along an X—X' line in FIGS. 23A.

FIG. 23A is a schematic plan view of a MOSFET of said first embodiment, and FIG. 23B is a schematic cross-sectional view along a line X—X' in FIG. 23A. There are shown a silicon substrate 101 of n-type semiconductor; a p⁻ well 102; a drain area 103 of n+ type formed in the p⁻ well 102; a source area 104 formed similarly to the drain area 103; a p+ sub area 105 for making ohmic contact between the p⁻ well 102 and the source electrode; a polycrystalline silicon gate electrode 106; a gate electrode wiring 106' connected to said gate electrode 106 by a through-hole; an insulation film 109 of silicon oxide; and a field insulation film 110 with bird's beak formed by selective oxidation.

An electrode 120, constituting the most characteristic structure of the present invention, is composed of monocrystalline aluminum, and penetrates the contact hole in the insulation layer 109 and the source area 104 and reaches the sub area 105 buried in the p⁻ well 102. Al source electrode wiring 121, formed on the insulation layer 109 and the electrode 120, is composed of aluminum. Al drain electrode 122, buried in the contact hole on the drain area 103, is composed of monocrystalline aluminum. There is also provided a drain electrode wiring 123.

In the following explained is the method for producing the MOSFET of the above-explained structure, with reference to FIGS. 24A to 24E.

Figure 24A:
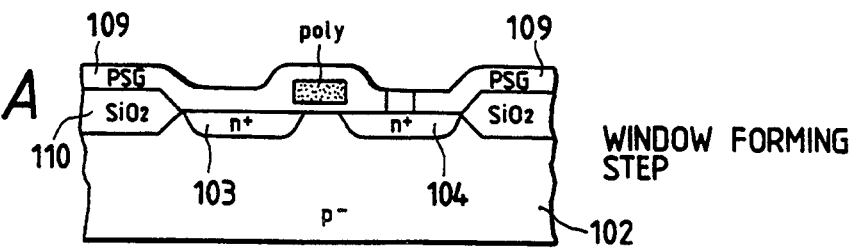
FIGS. 24A to 24E are schematic cross-sectional views showing the method for producing the MOSFET shown in FIGS. 23A and 23B.

On the silicon substrate, there were conducted, by already known manufacturing process, formation of the p⁻ well 102, drain area 103, source area 104 and field insulation film 110, then formation of the insulation layer 109 thereon, and formation of the gate electrode 106 in said insulation layer 109. Then a photolithographic process utilizing photoresist was applied to form a hole, as a photoresist image, on the insulation layer 109 above the source area 104. Then dry etching with $CHF_3$-$C_2F_6$ was conducted to form a hole in the insulation layer 109 down to the source area as shown in FIG. 24A (hole opening step).

Figure 24B:
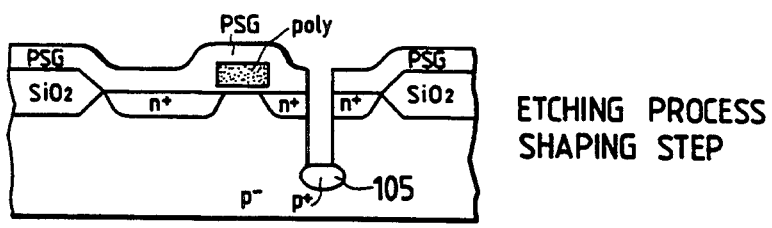

Subsequently dry etching with $Cl_2$-$CBrF_3$ was conducted without removal of the photoresist, thereby forming a hole penetrating the source area 104 and entering the p⁻ well 102 (etching step), and the sub area 105 was formed at the bottom of thus formed hole, as shown in FIG. 24B (p+ forming step).

Figure 24C:
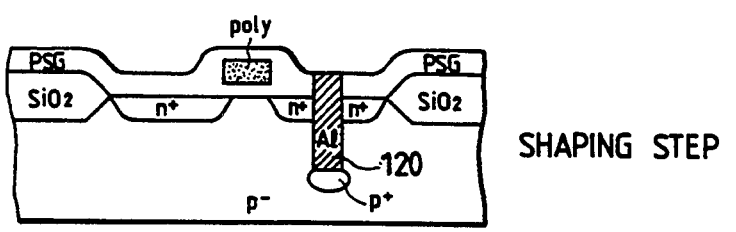

Then, as shown in FIG. 24C, aluminum was deposited to the upper surface of the insulation film 109 by the aforementioned Al—CVD method utilizing DMAH and hydrogen, with the substrate surface maintained at 270° C. (CVD—Al forming step).

Figure 24D:
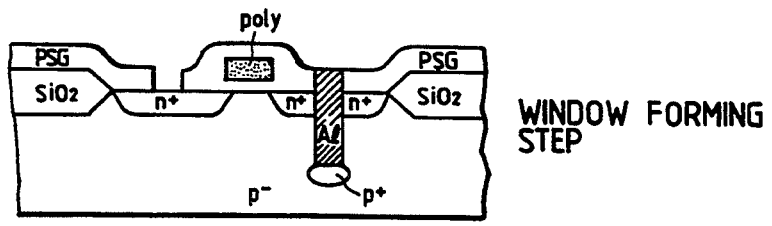
Figure 24E:
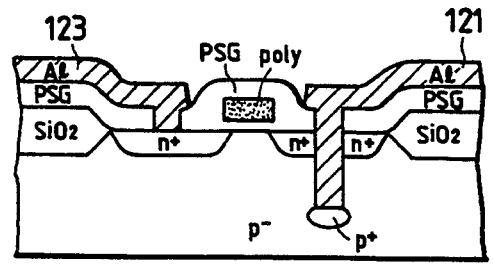

Then the contact hole is formed in the insulation layer 109 on the drain area 103 by a known process as shown in FIG. 24D (hole opening step), and aluminum was deposited by the above-mentioned Al—CVD method. The device was completed then by forming the source electrode wiring 121 and the drain electrode wiring 123 respectively on said electrode 102 and on the drain area 103 by sputtering as shown in FIG. 24E (Al wiring step).

As explained in the foregoing, the present invention allows to constitute a MOSFET, which is to be used with the source area and the sub area thereof in an electrically shortcircuited state, with necessary minimum components and without any unnecessary surface area.

EMBODIMENT 2

Figure 25A:
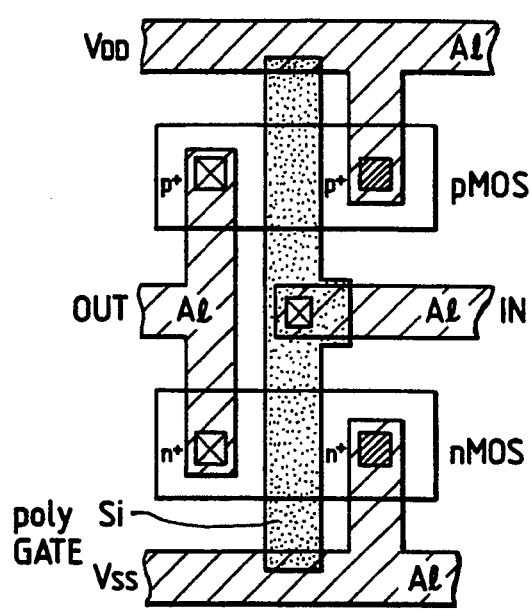
FIG. 25A is a schematic cross-sectional view of a semiconductor device, constituting a second embodiment of the present invention and applied to a CMOS inverter circuit.

FIG. 25A illustrates a second embodiment of the present invention.

In said second embodiment, the present invention is applied to a CMOS inverter circuit. The production method will not be explained as it is basically same as that of the first embodiment.

Figure 25B:
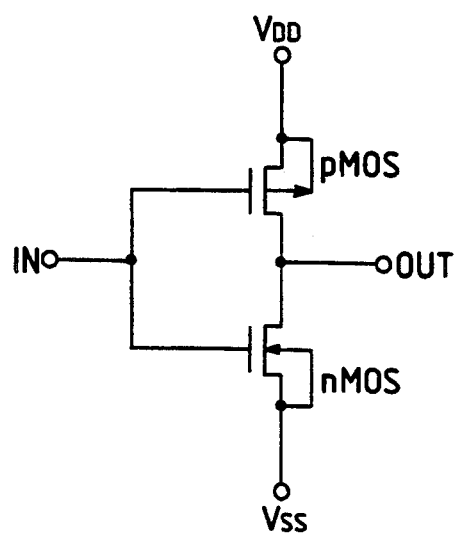
FIG. 25B is a circuit diagram of said embodiment.
Figure 25C:
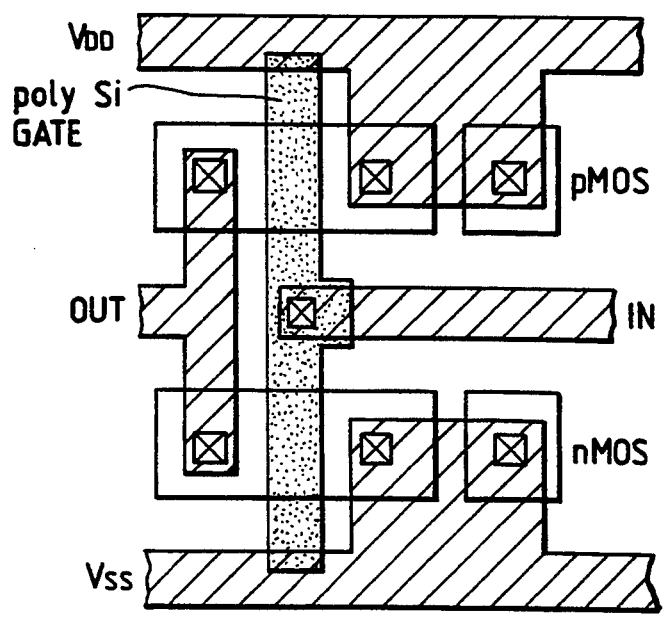
FIG. 25C is a schematic cross-sectional view of a device by the prior art, as a comparative example to the above-mentioned embodiment.

FIG. 25B is a circuit diagram of the present embodiment, and FIG. 25C is a similar device obtained by the prior art, for the purpose of comparison. As will be apparent from the comparison of FIG. 25C representing the prior art and FIG. 25A representing the present invention, the layout area of the device can be significantly reduced by the use of the electrode structure of the present invention in the connecting part of the source area and the sub area in the inverter circuit.

EMBODIMENT 3

Figure 26A:
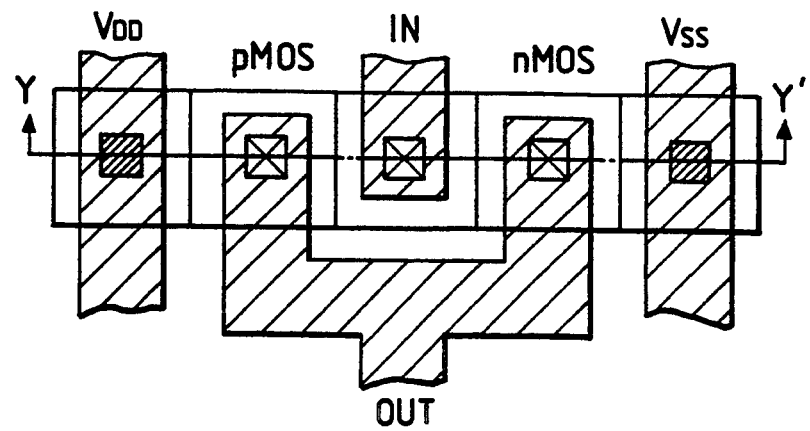
FIG. 26A is a schematic plan view of a semiconductor device constituting a third embodiment of the present invention and applied to a CMOS inverter circuit.
Figure 26B:
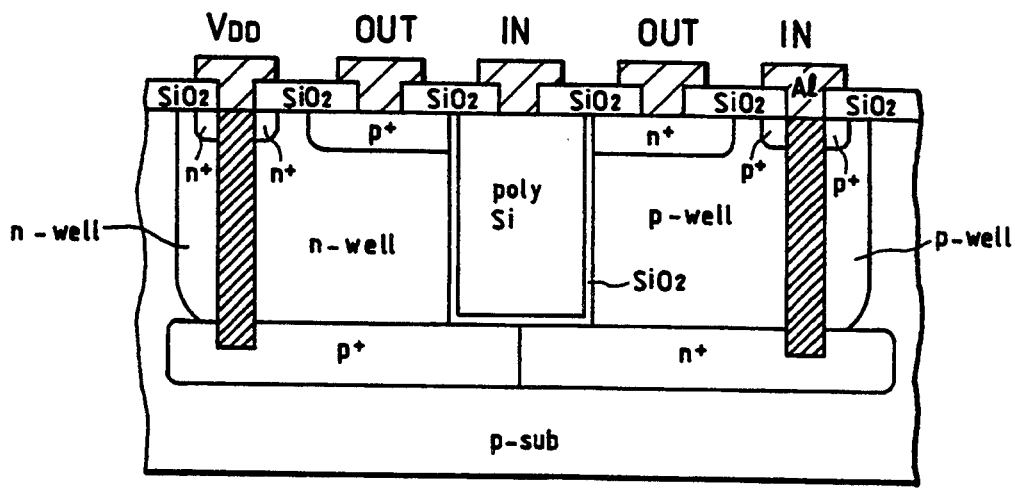
FIG. 26B is a schematic cross-sectional view along a line Y—Y' in FIG. 26A.
Figure 26C:
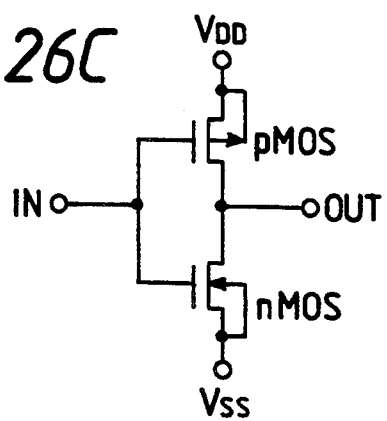
FIG. 26C is a circuit diagram of said embodiment.

A third embodiment of the present invention is illustrated in FIGS. 26A and 26B, and in a circuit diagram in FIG. 26C. The producing process of the present embodiment will not be explained as it is basically same as that of the foregoing first embodiment.

The present third embodiment also provides a CMOS inverter, but is different from the second embodiment in that the MOS transistors have a vertical structure. As will be apparent from the illustrations, the electrode structure of the present invention is even more effective for reducing the layout area in a circuit employing vertical MOS transistors.

EMBODIMENT 4

Figure 27A:
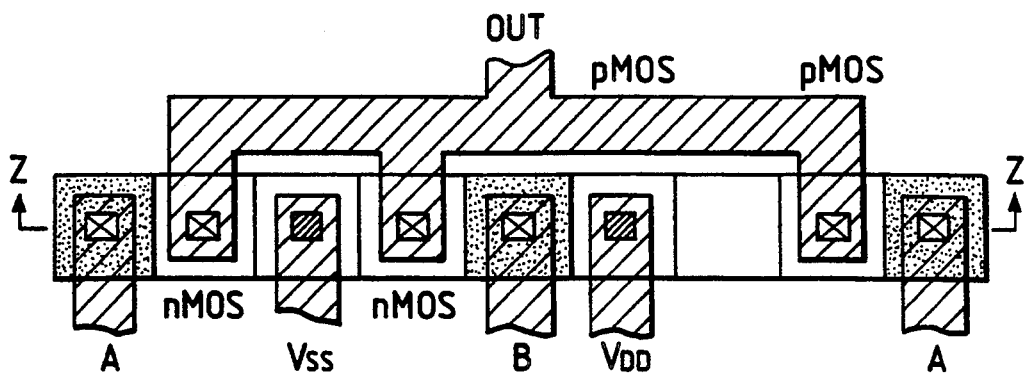
FIG. 27A is a schematic plan view of a semiconductor device constituting a fourth embodiment of the present invention and applied to a NAND circuit composed of vertical MOS transistors.
Figure 27B:
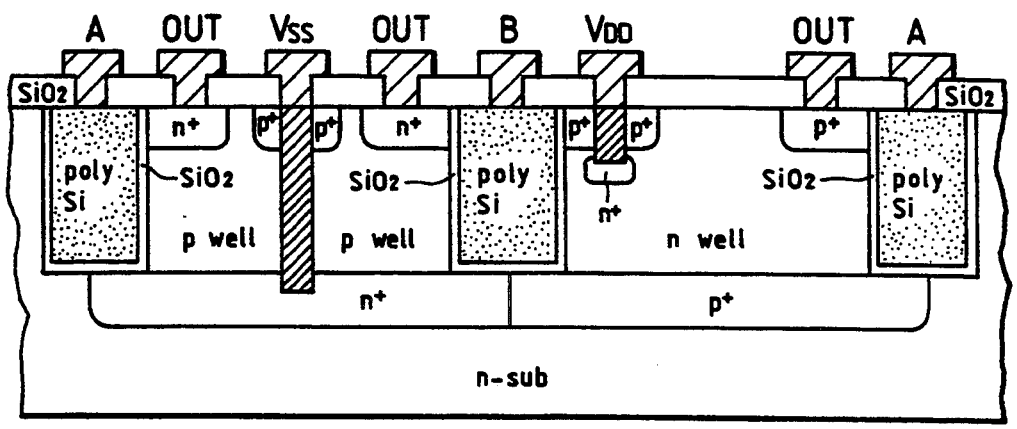
FIG. 27B is a schematic cross-sectional view along a line Z—Z' in FIG. 27A.
Figure 27C:
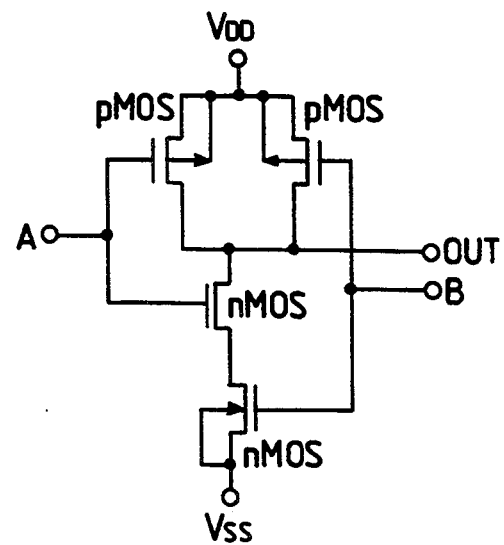
FIG. 27C is a circuit diagram of said embodiment.

Al fourth embodiment of the present invention is illustrated in FIGS. 27A and 27B, and shown in a circuit diagram in FIG. 27C. The producing process of the present embodiment will not be explained, as it is basically the same as that of the foregoing first embodiment.

In the present fourth embodiment, the present invention is applied to a NAND circuit composed again with vertical MOS transistors. As will be apparent from the illustrations, the electrode structure of the present invention is effective, also in this embodiment, for reducing the layout area.

EMBODIMENT 5

Figure 28:
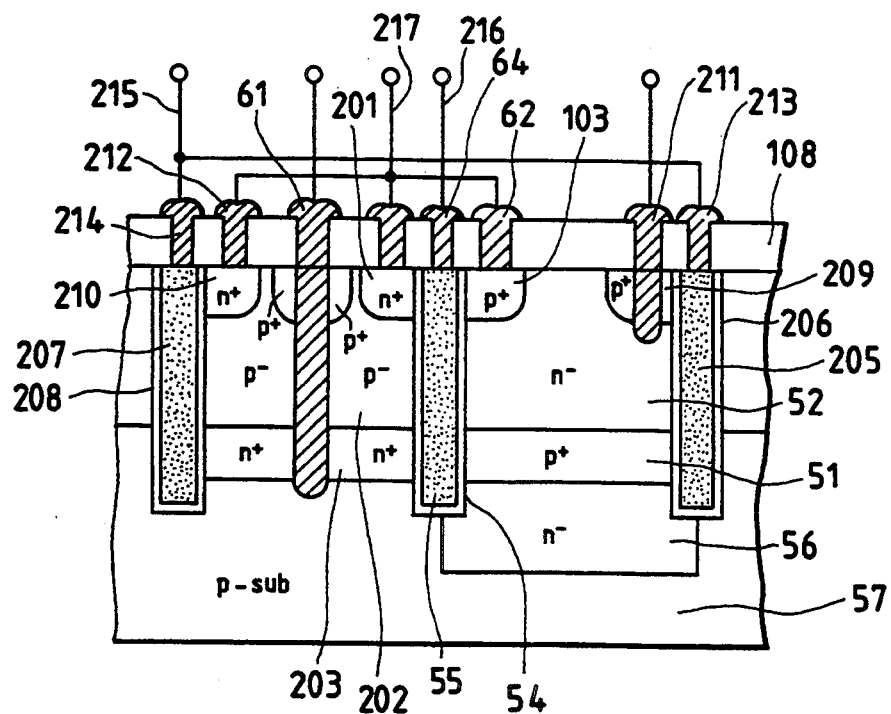
FIG. 28 is a schematic cross-sectional view of a fifth embodiment of the present invention.

FIG. 28 is a schematic cross-sectional view of a NOR circuit element constituting a fifth embodiment of the present invention.

In FIG. 28 there are shown polysilicon gates 205, 207 respectively of PMOS and NMOS transistors; gate insulation films 206, 208; a p+ drain layer 209 of the PMOS transistor; an n+source layer 210 of the NMOS transistor; and electrodes 211, 212, 213, 214 respectively for the drain 209, source 210, and polysilicon gates 205, 207. Also in this embodiment, the source 53 of the PMOS transistor and the sources 201, 210 of the NMOS transistor are mutually connected. At the NMOS side there is Formed a buried electrode 61 reaching the n drain layer 203, and, at the PMOS side, there is formed an electrode 211 for the p+ drain layer 59. These two electrodes 61, 211 are formed by selective deposition by the aforementioned Al—CVD method. The structure shown in FIG. 28 can be formed by steps similar to those shown in FIGS. 6 to 17.

Al first input terminal 215 of the NOR circuit is connected to the gate 207 of the, NMOS transistor and the gate 205 of the PMOS transistor. Al second input terminal 216 of the NOR circuit is connected to the common gate 55 of the NMOS and PMOS transistors.

The present device functions in the following manner. When the first input terminal 215 receives voltage equal to or larger than $V_{th}$ of the NMOS transistor, for example a highest potential and the second input terminal 216 receives a voltage equal to or lower than [highest potential+$V_{th}$ of PMOS transistor], for example a lowest potential, a channel is formed below the NMOS transistor, whereby the drain 203 and the source 210 thereof are connected and the output terminal 217 is maintained at the lowest potential. In the PMOS transistor in this state, the p+ layer 101 and the source area 53 are connected through the channel, but the source 53 is not connected to the power supply since a channel is not formed between the drain 209 and the p+ layer 51. When the voltages applied to the first and second input terminals 215, 216 are interchanged, the drain 203 and the source 201 of the NMOS transistor are connected through the channel, whereby the output terminal is maintained at the lowest potential. In this state the drain 209 and the p+ layer 51 of the PMOS transistor are connected through the channel, but the source 53 is not connected to the power supply, since a channel is not formed between the source 53 and the p+ layer 51 of the PMOS transistor. Then, when the first and second input terminals 215, 216 both receive a voltage equal to or higher than $V_{th}$ of the NMOS transistor, for example the highest potential, a channel is formed below the NMOS transistor, whereby the drain 203 is connected with the sources 201, 210 through said channel and the output terminal 217 is maintained at the lowest potential. The source 53 is not connected to the power supply, since a channel is not formed below the PMOS transistor. Then, when the first and second input terminals 215, 216 both receive a voltage equal to or lower than [highest potential+$V_{th}$ of PMOS transistor], for example the lowest potential, a channel is formed below the PMOS transistor, whereby the source 53 is connected to the drain 209 through the p+ layer 51 and the output terminal 217 is maintained at the highest potential. In this state the sources 201, 210 are not connected to the power supply, since a channel is not formed below the NMOS transistor.

The NOR function is achieved as explained above, since the output terminal is maintained at the highest potential only when the first and second input termianls are given the lowest potential and at the lowest potential in other combinations of the input potentials.

Also the present embodiment can reduce the number of electrodes and the dimension of the element, as in the example shown in FIG. 5.

EMBODIMENT 6

Figure 29:
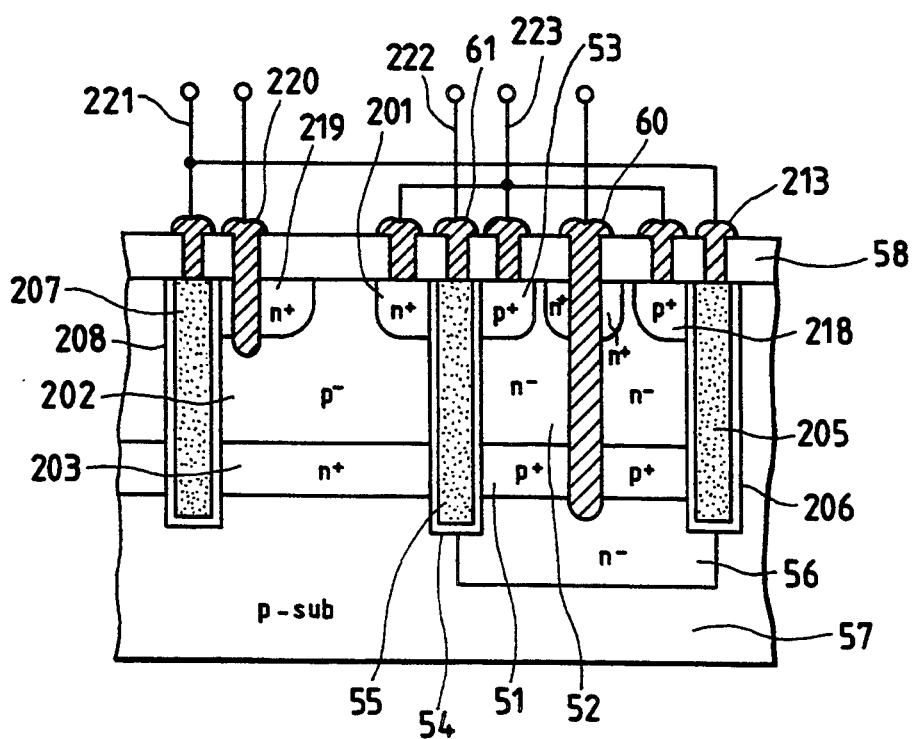
FIG. 29 is a schematic cross-sectional view of a sixth embodiment of the present invention.

FIG. 29 is a schematic cross-sectional view of a NAND circuit device constituting a sixth embodiment of the present invention.

In FIG. 29, there are shown a p+ source layer 218 of the PMOS transistor, and an n+ drain layer 219 of the NMOS transistor. In the present device, a buried electrode 60 reaching a p+ drain layer 51 is formed at the PMOS side, and an electrode 220 for the n+ drain 219 is formed at the NMOS side. Said electrode 220 is also formed by selective aluminum deposition utilizing DMAH and hydrogen. The structure shown in FIG. 29 can be prepared by steps similar to those in FIGS. 6 to 17.

A first input terminal 221 of the NAND circuit is connected to the gate 207 of the NMOS transistor and the gate 205 of the PMOS transistor. Al second input terminal 222 of the NAND circuit is connected to the common gate 55 of the NMOS and PMOS transistors.

The device of the present embodiment functions in the following manner. When the first input terminal 221 receives a voltage equal to or higher than $V_{th}$ of the NMOS transistor, for example a highest potential, and the second input terminal 222 receives a voltage equal to or lower than [highest potential+$V_{th}$ of PMOS transistor], for example a lowest potential, a channel is formed below the PMOS transistor whereby the drain 51 and the source 53 thereof are connected and an output terminal 223 is maintained at the highest potential. In the NMOS transistor in this state, the n+ layer 203 is connected with the drain 219 through the channel, but the source 201 is not connected to the power source since a channel is not formed between the source 201 and the n+ layer 203. When the voltages applied to the first and second input terminals 221, 222 are interchanged, the drain 51 and the source 218 of the PMOS transistor are connected through the channel whereby the output terminal 223 is maintained at the highest potential. In this state the source 201 is not connected to the power source since a channel is not formed between the drain 219 and the n+ layer 203 of the NMOS transistor. Then, when the first and second input terminals both receive a voltage equal to or lower than [highest potential+$V_{th}$ of PMOS transistor], for example the lowest potential, a channel is formed below the PMOS transistor, whereby the drain 51 is connected with the source 53, 218 through said channel and the output terminal 223 is maintained at the highest potential. In this state the source 201 is not connected to the power source, since a channel is not formed below the NMOS transistor. Then, when he first and second input terminals both receive a voltage equal to or higher than $V_{th}$ of the NMOS transistor, for example the highest potential, a channel is formed below the NMOS transistor, whereby the drain 219 is connected with the source 200 through the n+ layer 203 and the output terminal is maintained at the lowest potential. In this state the sources 53, 218 are not connected to the power source, since a channel is not formed below the PMOS transistor.

The NAND function is thus achieved, as the output terminal is maintained at the lowest potential only when the first and second input terminals are given the highest potential, but is maintained at the highest potential at other combinations of the input potentials.

Also, this NAND circuit device is provided with a reduced number of electrodes and can therefore reduce the dimension of the device.

In the foregoing embodiments 5 and 6, similar advantages can be obtained even if the semiconductors of n- and p-type are interchanged.

Similar advantages can be obtained also when the polysilicon electrode is replaced by a metal or silicide electrode.

As explained in the foregoing, the present invention allows obtaining a semiconductor device provided with very small functional elements, which can be constructed by necessary minimum components without any unnecessary surface area, thereby being capable of significantly reducing the layout area and adapted for achieving a fine geometry and a high level of integration.

We claim:

1. A semiconductor device having a semiconductor body provided with a vertical field-effect transistor, which body comprises:
   a first semiconductor region and a second semiconductor region of a first conductivity type to provide source and drain regions;
   a third semiconductor region of a second conductivity type different from said first conductivity type having an intermediate portion to provide a channel portion and a surface portion;
   said first semiconductor region disposed on said intermediate portion;
   said third semiconductor region disposed on said second semiconductor region;
   a gate electrode separated from said intermediate portion by an insulating material, wherein said source and drain regions and said channel portion are arranged only vertically along a side surface of said gate electrode; and
   a buried electrode electrically connected with said second semiconductor region and said third semiconductor region via a through hole penetrating said third semiconductor region, wherein said second region and said third region are thereby short circuited; and wherein said buried electrode is formed in said body.

2. A semiconductor device according to claim 1, constituting a NOT circuit element.

3. A semiconductor device according to claim 1, constituting a NOR circuit element.

4. A semiconductor device according to claim 1, constituting a NAND circuit element.

5. A semiconductor device according to claim 1, wherein said second semiconductor region is a drain.

6. A semiconductor device according to claim 1, wherein said second semiconductor region is buried within said semiconductor body, and is provided on a substrate of the second conductivity type.

7. A semiconductor device according to claim 6, wherein said buried electrode is contacted with said substrate.

8. A semiconductor device according to claim 1, wherein said second semiconductor region is buried within said semiconductor body, and is provided on a fourth semiconductor region of the second conductivity type.

9. A semiconductor device according to claim 8, wherein said fourth semiconductor region is provided on a substrate of the first conductivity type.

10. A semiconductor device according to claim 1, wherein said buried electrode is made of aluminum.

11. A semiconductor device having a semiconductor body provided with a vertical complementary MOS inverter, said body comprises:
    a first semiconductor region and a second semiconductor region of an N conductivity type to provide source and drain regions;
    a third semiconductor region of a P conductivity type having an intermediate portion to provide a channel portion and a surface portion;
    said first semiconductor region disposed on said intermediate portion;
    said third semiconductor region disposed on said second semiconductor region;
    a fourth semiconductor region and a fifth semiconductor region of a P conductivity type to provide source and drain regions;
    a sixth semiconductor region of an N conductivity type having an intermediate portion to provide a channel portion and a surface portion;
    said fourth semiconductor region disposed on said intermediate portion;
    said sixth semiconductor region disposed on said fifth semiconductor region;
    a common gate electrode separated from said intermediate portions of said third semiconductor region and said sixth semiconductor region by a gate insulator to provide an input-terminal, wherein each of said source and drain regions and said channel portions are arranged only vertically along opposite sides of said common gate electrodes;
    a first buried electrode electrically connected with said second semiconductor region and said third semiconductor region which are thereby short circuited; and
    a second buried electrode electrically connected with said fifth semiconductor region and said sixth semiconductor region which are thereby short circuited;
    wherein said first buried electrode and said second buried electrode are formed in said body.

12. A semiconductor device having a semiconductor body provided with at least two vertical field-effect transistors said body comprising:
    at least two first semiconductor regions and a second semiconductor region of a first conductivity type to provide source and drain regions;
    a third semiconductor region of a second conductivity type different from said first conductivity type having an intermediate portion to provide at least two channel portions and a surface portion;
    said first semiconductor regions disposed on said intermediate portion;
    said third semiconductor region disposed on said second semiconductor region;
    at least two gate electrodes separated from said intermediate portions by an insulating material, wherein each of said source and drain regions and channel portions are arranged only vertically along a side surface of each said at least two gate electrodes; and
    a buried electrode electrically connected with one of said first semiconductor regions and said third semiconductor region via a through hole penetrating the one of said first semiconductor regions, wherein the one of said first region and said third region are thereby short circuited, and wherein said buried electrode is formed in said body.

* * * * *

UNITED STATES PATENT AND TRADEMARK OFFICE
CERTIFICATE OF CORRECTION

PATENT NO. : 5,378,914
DATED : January 3, 1995
INVENTOR(S) : HAYAO OHZU, ET AL.

It is certified that error appears in the above-identified patent and that said Letters Patent is hereby corrected as shown below:

ON TITLE PAGE

In [56] References Cited, under U.S. PATENT DOCUMENTS:
"Grover, III" should read --Groover, III--.

In [56] References Cited, under FOREIGN PATENT DOCUMENTS:
"0288057  11/1988  Japan" should be deleted and
"01244646  9/1989  Japan" should read
--1-244646  9/1989  Japan--.

COLUMN 1

Line 26, "However" should read --However,--.
Line 31, "has" should read --have--.
Line 46, "function" should read --functional--.
Line 51, "source 4" should read --source area 4--.
Line 52, "sub area" should read --sub area 5--.

COLUMN 2

Line 37, "n layer 506" should read --$n^+$ layer 506--.
Line 38, "p drain layer 507" should read
--$p^+$ drain layer 507--.
Line 51, "508,509" should read --508, 509--.

COLUMN 3

Line 9, "However" should read --However,--.
Line 49, "conductive," should read --conductive type,--.

COLUMN 4

Line 61, "pan" should read --plan--.

UNITED STATES PATENT AND TRADEMARK OFFICE
CERTIFICATE OF CORRECTION

PATENT NO. : 5,378,914
DATED : January 3, 1995
INVENTOR(S) : HAYAO OHZU, ET AL.

It is certified that error appears in the above-identified patent and that said Letters Patent is hereby corrected as shown below:

COLUMN 5

Line 3, "4B;" should read --4B,--.
    Line 23, "FIGS. 23A;" should read --FIG. 23A;--.

COLUMN 6

Line 57, "fill," should read --fill-- and
              "ratio," should read --ratio--.
    Line 64, "selectively" should read --selectivity--.

COLUMN 7

Line 15, "the form" should read --to form--.
    Line 49, "flow" should read --flows--.

COLUMN 8

Line 10, "Besides" should read --Besides,--.
    Line 31, "A" should read --Al--.
    Line 37, "abovementioned" should read --above-mentioned--.
    Line 57, "selectively" should read --selectivity--.

COLUMN 9

Line 52, "FIG. 2," should read --FIG. 18,--.

COLUMN 10

Line 23, "same" should read --the same--.
    Line 58, "Al" should read --A--.
    Line 66, "A," should read --Al,--.

UNITED STATES PATENT AND TRADEMARK OFFICE
CERTIFICATE OF CORRECTION

PATENT NO. : 5,378,914

DATED : January 3, 1995

INVENTOR(S) : HAYAO OHZU, ET AL.

It is certified that error appears in the above-identified patent and that said Letters Patent is hereby corrected as shown below:

COLUMN 11

Line 17, "apertures 403, 404" should read
           --apertures 403, 404--.
    Line 35, "Al" should read --A-- and "DH" should read
           --DMAH--.
    Line 57, "$5 \times 10^{-1}$ Torr." should read --$5 \times 10^{-6}$ Torr.--.

COLUMN 12

Line 1, "n" should read --in--.

COLUMN 13

Line 34, "90-95%" should read --90-95%,--.

COLUMN 16

Line 34, "same" should read --the same--.
    Line 45, "Al" should read --A--.
    Line 65, "212,213" should read --212, 213--.

COLUMN 17

Line 2, "Formed" should read --formed-- and
          "n" should read --$n^+$--.
    Line 10, "the," should read --the--.
    Line 9, "Al" should read --A--.
    Line 58, "termianls" should read --terminals--.

UNITED STATES PATENT AND TRADEMARK OFFICE
CERTIFICATE OF CORRECTION

PATENT NO. : 5,378,914
DATED : January 3, 1995
INVENTOR(S) : HAYAO OHZU, ET AL.

It is certified that error appears in the above-identified patent and that said Letters Patent is hereby corrected as shown below:

COLUMN 18

Line 13, "Al" should read --A--.
Line 43, "source 53, 218" should read --sources 53, 218--.

COLUMN 20

Line 43, "transistors" should read --transistors,--.

Signed and Sealed this

Twentieth Day of June, 1995

Attest:

BRUCE LEHMAN

*Attesting Officer*     *Commissioner of Patents and Trademarks*